United States Patent
Adler

(10) Patent No.: US 9,727,679 B2
(45) Date of Patent: Aug. 8, 2017

(54) SYSTEM ON CHIP CONFIGURATION METADATA

(71) Applicant: Intel Corporation, Santa Clara, CA (US)

(72) Inventor: Robert P. Adler, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 61 days.

(21) Appl. No.: 14/578,418

(22) Filed: Dec. 20, 2014

(65) Prior Publication Data

US 2016/0180001 A1   Jun. 23, 2016

(51) Int. Cl.
G06F 17/50   (2006.01)

(52) U.S. Cl.
CPC ................. G06F 17/5045 (2013.01)

(58) Field of Classification Search
CPC .................................. G06F 17/5045
USPC ........................................ 716/138
See application file for complete search history.

(56) References Cited

U.S. PATENT DOCUMENTS

| 7,769,929 | B1 | 8/2010 | Pritchard |
| 8,090,564 | B1* | 1/2012 | Michiels et al. ............... 703/13 |
| 2002/0188910 | A1 | 12/2002 | Zizzo |
| 2003/0009658 | A1 | 1/2003 | Chen et al. |
| 2003/0093764 | A1 | 5/2003 | Devins et al. |
| 2009/0044044 | A1 | 2/2009 | Harter et al. |
| 2009/0144593 | A1* | 6/2009 | Chakraborty et al. ........ 714/726 |
| 2009/0144594 | A1* | 6/2009 | Chakraborty et al. ........ 714/732 |
| 2011/0131456 | A1 | 6/2011 | Klinglesmith et al. |
| 2013/0086296 | A1* | 4/2013 | Lakshmanamurthy et al. ............................. 710/314 |
| 2013/0117232 | A1* | 5/2013 | Lee et al. ...................... 707/639 |
| 2013/0138612 | A1* | 5/2013 | Iyer ............................ 707/638 |
| 2014/0082237 | A1 | 3/2014 | Wertheimer et al. |
| 2014/0149953 | A1 | 5/2014 | Davidovic et al. |
| 2014/0244932 | A1 | 8/2014 | Hebbar et al. |
| 2014/0298281 | A1 | 10/2014 | Varadarajan et al. |
| 2015/0188847 | A1* | 7/2015 | Chopra et al. ................ 716/108 |
| 2015/0372677 | A1 | 12/2015 | Sadowski |

(Continued)

FOREIGN PATENT DOCUMENTS

| WO | WO 02-05144 | 1/2002 |
| WO | WO 03-073314 | 9/2003 |

(Continued)

OTHER PUBLICATIONS

International Search Report and Written Opinion in International Application No. PCT/US2015/062563 mailed Feb. 29, 2016.

(Continued)

*Primary Examiner* — Suchin Parihar
(74) *Attorney, Agent, or Firm* — Patent Capital Group

(57) ABSTRACT

A topology metadata file is identified that describes a topology of a system on chip (SoC) to be created, where the topology includes a plurality of computing blocks to be interconnected by a fabric. A corresponding computing block metadata file is identified for each of the plurality of computing blocks, where each of the computing block metadata files is to describe attributes of the corresponding computing block. The topology metadata file and the computing block metadata files are parsed to identify configuration attributes of the SoC. An intermediate representation of the SoC is generated based on the configuration attributes.

19 Claims, 12 Drawing Sheets

(56) References Cited

U.S. PATENT DOCUMENTS

2016/0132441 A1  5/2016  Styles et al.
2016/0179161 A1  6/2016  Adler et al.
2016/0180001 A1  6/2016  Adler

FOREIGN PATENT DOCUMENTS

WO   WO 2016-099812   6/2016
WO   WO 2016-105818   6/2016

OTHER PUBLICATIONS

International Search Report and Written Opinion in International Application No. PCT/US2015/062030 mailed Feb. 29, 2016.
Final Office Action in U.S. Appl. No. 14/579,565 dated Mar. 31, 2017.

* cited by examiner

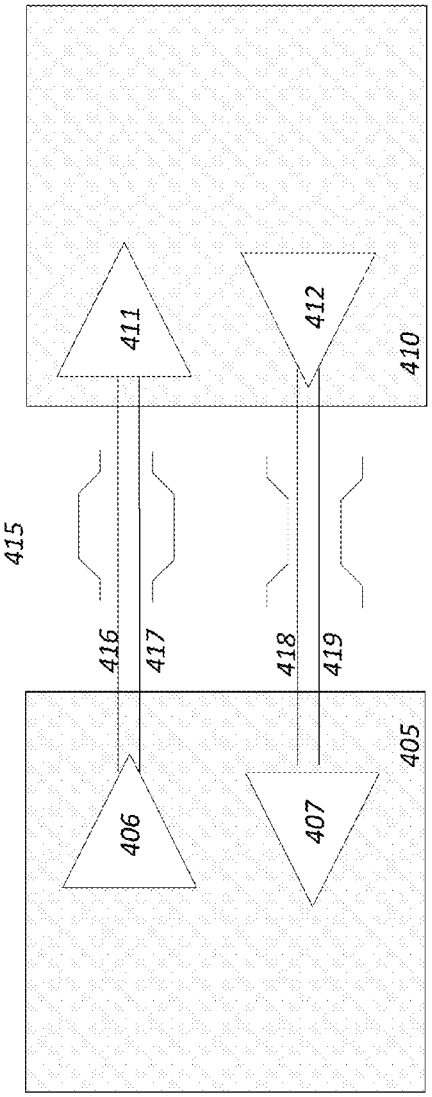

800a

```
"psf" :
    ["psf1",
    "pcie",
    ["psf2",
    "cunit",
    "p2sb",
    "spi",
    "pmc"
    ]
]
"spi" :  {"ip"  :  "SPI",
         "RootSpace"  :  0
         },
},
"pcie" :  {
    "ip"   :  "SPA",
    "ChannelMap"  :  "VC0b  VC0b  VC0b  VC0b"
},
"cunit" :  {
    "ip"   :  "CUNIT",
    "clk"  :  "cunit_100"
},
"p2sb" :  {"ip"  :  "P2S"},
"psf1" :  {
    "ip"   :  "psf2",
    "clk"  :  "clk_266",
    "params"  :  {
        "intDataWidth" :  512bits,
        "maxPayloadSize"  :  64,
        "numchan"   :  2,
        "ChannelMap" :  "VC0b  VC1b"
    }
},
"pmc" :  {"ip"  :  "PMC",
        "DevicePMC_Host_0"  :  26,
        "DevicePMC_Host_1"  :  13,
        "DevicePMC_Host_2"  :  13
            },
}
```

```
# ----------------------------------
# Device Information for SPA_01
# ----------------------------------
deviceinfo di
di.CH0CH2TCMAP = 0;
di.CH1CH2TCMAP = 1;
di.CH2CH2TCMAP = 2;
di.CH0_P_MSTDATALENMax = 16;
di.CH0_NP_MSTDATALENMax = 1;
di.CH0_C_MSTDATALENMax = 16;
di.CH0_P_TGTDATALENMax = 16;
di.CH0_NP_TGTDATALENMax = 1;
di.CH0_C_TGTDATALENMax = 16;
di.CH1_P_MSTDATALENMax = 16;
di.CH1_NP_MSTDATALENMax = 1;
di.CH1_C_MSTDATALENMax = 16;
di.CH1_P_TGTDATALENMax = 16;
di.CH1_NP_TGTDATALENMax = 1;
di.CH1_C_TGTDATALENMax = 16;
di.CH2_P_MSTDATALENMax = 16;
di.CH2_NP_MSTDATALENMax = 1;
di.CH2_C_MSTDATALENMax = 16;
di.CH2_P_TGTDATALENMax = 16;
di.CH2_NP_TGTDATALENMax = 1;
di.CH2_C_TGTDATALENMax = 16;
di.D_WIDTH = 128;
di.Ma_Payload_Size = 64;
di.NUMCHAN = 3;
di.PARITY_REQUIRED = 0;
di.VCP = 0;
di.CH0MCSHEnable = 0;
di.CH0MCDestChan = 0;
di.CH0MCXACTADDR = 00_B0_00D1
di.CH1MCSHEnable = 0;
di.CH1MCDestChan = 0;
di.CH1MCXACTADDR = 00_B0_00D1
di.CH2MCSHEnable = 0;
di.CH2MCDestChan = 0;
di.CH2MCXACTADDR = 00_B0_00D1
di.FunctionList = {SPA_01_2 SPA01_1 SPA01_0}
```

```
# ------------------------------------
# Decode Information for SPA_01_1
# ------------------------------------
Functioninfo SPA_01_1
SPA_01.APICRange = 1;
SPA_01.APICSupport = 1;
SPA_01.B0BarSize = 0x0;
SPA_01.B0BarType = 0;
SPA_01.B1BarSize = 0x0;
SPA_01.B1BarType = 0;
SPA_01.B2BarSize = 0x0;
SPA_01.B2BarType = 0;
SPA_01.B3BarSize = 0x0;
SPA_01.B3BarType = 0;
SPA_01.CAS32Enable = 0;
SPA_01.CAS64Enable = 0;
SPA_01.CfgDisOffset = 0x1;
SPA_01.CfgRd0Enable = 1;
SPA_01.CfgRd1Enable = 1;
SPA_01.CfgWr0Enable = 1;
SPA_01.CfgWr1Enable = 1;
SPA_01.CplDEnable = 1;
SPA_01.CplDLkEnable = 0;
SPA_01.CplEnable = 1;
SPA_01.CplLkEnable = 0;
SPA_01.FuncType = pcie;
SPA_01.FunctionName = SPA_01;
SPA_01.FunctionNumber = 1;
SPA_01.HeaderType = type1;
SPA_01.IOBaseEnabled = 1;
SPA_01.IOBaseRdEnable = 1;
SPA_01.MRd32Enable = 1;
SPA_01.MRd64Enable = 1;
SPA_01.MRdLk32Enable = 0;
SPA_01.MRdLk64Enable = 0;
SPA_01.MWr32Enable = 1;
SPA_01.MWr64Enable = 1
```

SYSTEM ON CHIP CONFIGURATION METADATA

FIELD

This disclosure pertains to computing system, and in particular (but not exclusively) to system design tools.

BACKGROUND

Advances in semi-conductor processing and logic design have permitted an increase in the amount of logic that may be present on integrated circuit devices. As a corollary, computer system configurations have evolved from a single or multiple integrated circuits in a system to multiple cores, multiple hardware threads, and multiple logical processors present on individual integrated circuits, as well as other interfaces integrated within such processors. A processor or integrated circuit typically comprises a single physical processor die, where the processor die may include any number of cores, hardware threads, logical processors, interfaces, memory, controller hubs, etc.

As a result of the greater ability to fit more processing power in smaller packages, smaller computing devices have increased in popularity. Smartphones, tablets, ultrathin notebooks, and other user equipment have grown exponentially. However, these smaller devices are reliant on servers both for data storage and complex processing that exceeds the form factor. Consequently, the demand in the high-performance computing market (i.e. server space) has also increased. For instance, in modern servers, there is typically not only a single processor with multiple cores, but also multiple physical processors (also referred to as multiple sockets) to increase the computing power. But as the processing power grows along with the number of devices in a computing system, the communication between sockets and other devices becomes more critical.

In fact, interconnects have grown from more traditional multi-drop buses that primarily handled electrical communications to full blown interconnect architectures that facilitate fast communication. Unfortunately, as the demand for future processors to consume at even higher-rates corresponding demand is placed on the capabilities of existing interconnect architectures.

BRIEF DESCRIPTION OF THE DRAWINGS

FIG. 3 illustrates an embodiment of a request or packet to be generated or received within an interconnect architecture.

FIG. 4 illustrates an embodiment of a transmitter and receiver pair for an interconnect architecture.

FIGS. 8A-8C are portions of example metadata files that can be used to generate data embodying an intermediate representation of a system-on-chip by a design tool.

Like reference numbers and designations in the various drawings indicate like elements.

DETAILED DESCRIPTION

Figure 1:
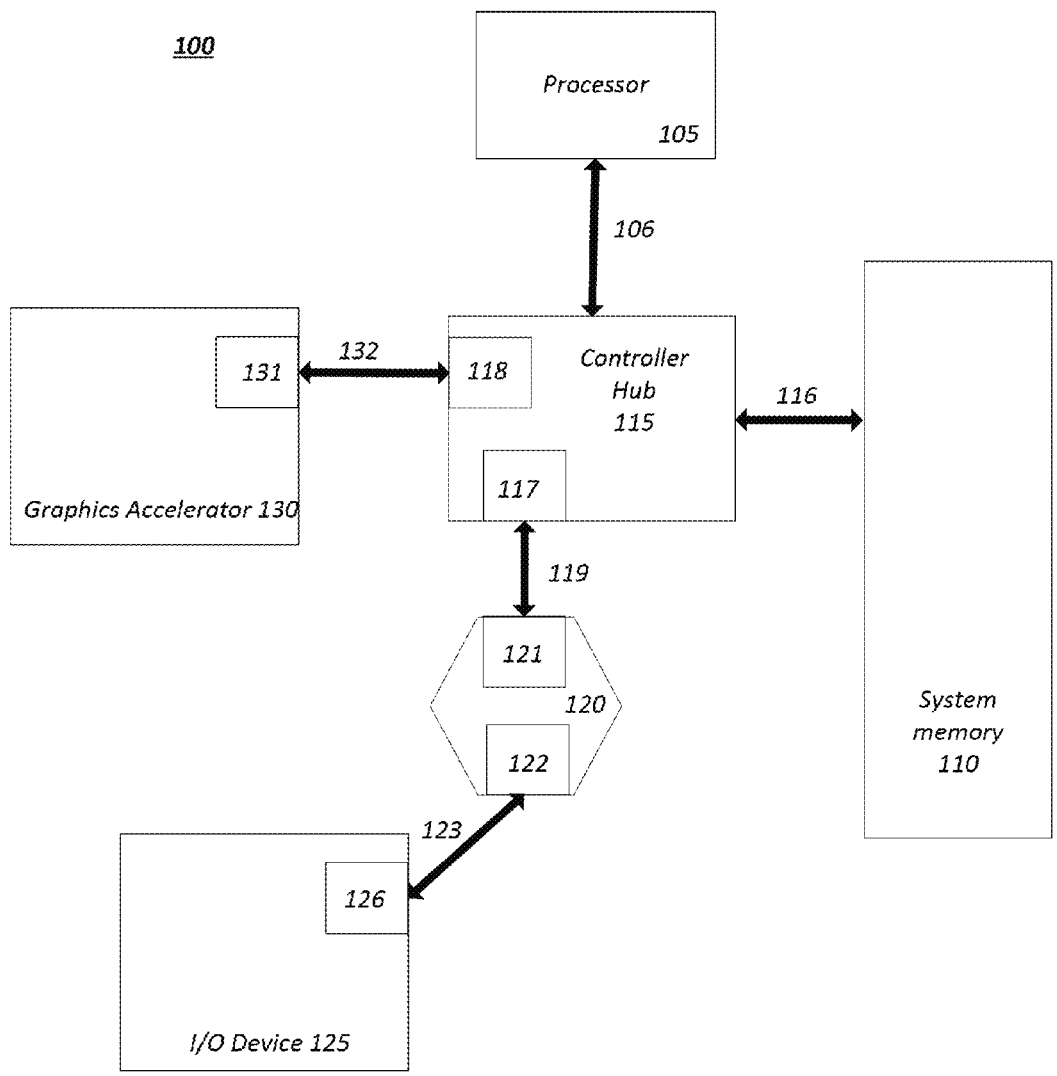
FIG. 1 illustrates an embodiment of a computing system including an interconnect architecture.

In the following description, numerous specific details are set forth, such as examples of specific types of processors and system configurations, specific hardware structures, specific architectural and micro architectural details, specific register configurations, specific instruction types, specific system components, specific measurements/heights, specific processor pipeline stages and operation etc. in order to provide a thorough understanding of the present invention. It will be apparent, however, to one skilled in the art that these specific details need not be employed to practice the present invention. In other instances, well known components or methods, such as specific and alternative processor architectures, specific logic circuits/code for described algorithms, specific firmware code, specific interconnect operation, specific logic configurations, specific manufacturing techniques and materials, specific compiler implementations, specific expression of algorithms in code, specific power down and gating techniques/logic and other specific operational details of computer system haven't been described in detail in order to avoid unnecessarily obscuring the present invention.

Although the following embodiments may be described with reference to energy conservation and energy efficiency in specific integrated circuits, such as in computing platforms or microprocessors, other embodiments are applicable to other types of integrated circuits and logic devices. Similar techniques and teachings of embodiments described herein may be applied to other types of circuits or semiconductor devices that may also benefit from better energy efficiency and energy conservation. For example, the disclosed embodiments are not limited to desktop computer systems or Ultrabooks™. And may be also used in other devices, such as handheld devices, tablets, other thin notebooks, systems on a chip (SOC) devices, and embedded applications. Some examples of handheld devices include cellular phones, Internet protocol devices, digital cameras, personal digital assistants (PDAs), and handheld PCs. Embedded applications typically include a microcontroller, a digital signal processor (DSP), a system on a chip, network computers (NetPC), set-top boxes, network hubs, wide area network (WAN) switches, or any other system that can perform the functions and operations taught below. Moreover, the apparatus', methods, and systems described herein are not limited to physical computing devices, but may also relate to software optimizations for energy conservation and efficiency. As will become readily apparent in the description below, the embodiments of methods, apparatus', and systems described herein (whether in reference to hardware, firmware, software, or a combination thereof) are vital to a 'green technology' future balanced with performance considerations.

As computing systems are advancing, the components therein are becoming more complex. As a result, the interconnect architecture to couple and communicate between the components is also increasing in complexity to ensure bandwidth requirements are met for optimal component operation. Furthermore, different market segments demand different aspects of interconnect architectures to suit the market's needs. For example, servers require higher performance, while the mobile ecosystem is sometimes able to sacrifice overall performance for power savings. Yet, it's a singular purpose of most fabrics to provide highest possible performance with maximum power saving. Below, a number of interconnects are discussed, which would potentially benefit from aspects of the invention described herein.

One interconnect fabric architecture includes the Peripheral Component Interconnect (PCI) Express (PCIe) architecture. A primary goal of PCIe is to enable components and devices from different vendors to inter-operate in an open architecture, spanning multiple market segments; Clients (Desktops and Mobile), Servers (Standard and Enterprise), and Embedded and Communication devices. PCI Express is a high performance, general purpose I/O interconnect defined for a wide variety of future computing and communication platforms. Some PCI attributes, such as its usage model, load-store architecture, and software interfaces, have been maintained through its revisions, whereas previous parallel bus implementations have been replaced by a highly scalable, fully serial interface. The more recent versions of PCI Express take advantage of advances in point-to-point interconnects, Switch-based technology, and packetized protocol to deliver new levels of performance and features. Power Management, Quality Of Service (QoS), Hot-Plug/Hot-Swap support, Data Integrity, and Error Handling are among some of the advanced features supported by PCI Express.

Referring to FIG. 1, an embodiment of a fabric composed of point-to-point Links that interconnect a set of components is illustrated. System 100 includes processor 105 and system memory 110 coupled to controller hub 115. Processor 105 includes any processing element, such as a microprocessor, a host processor, an embedded processor, a co-processor, or other processor. Processor 105 is coupled to controller hub 115 through front-side bus (FSB) 106. In one embodiment, FSB 106 is a serial point-to-point interconnect as described below. In another embodiment, link 106 includes a serial, differential interconnect architecture that is compliant with different interconnect standard.

System memory 110 includes any memory device, such as random access memory (RAM), non-volatile (NV) memory, or other memory accessible by devices in system 100. System memory 110 is coupled to controller hub 115 through memory interface 116. Examples of a memory interface include a double-data rate (DDR) memory interface, a dual-channel DDR memory interface, and a dynamic RAM (DRAM) memory interface.

In one embodiment, controller hub 115 is a root hub, root complex, or root controller in a Peripheral Component Interconnect Express (PCIe or PCIE) interconnection hierarchy. Examples of controller hub 115 include a chipset, a memory controller hub (MCH), a northbridge, an interconnect controller hub (ICH) a southbridge, and a root controller/hub. Often the term chipset refers to two physically separate controller hubs, i.e. a memory controller hub (MCH) coupled to an interconnect controller hub (ICH). Note that current systems often include the MCH integrated with processor 105, while controller 115 is to communicate with I/O devices, in a similar manner as described below. In some embodiments, peer-to-peer routing is optionally supported through root complex 115.

Here, controller hub 115 is coupled to switch/bridge 120 through serial link 119. Input/output modules 117 and 121, which may also be referred to as interfaces/ports 117 and 121, include/implement a layered protocol stack to provide communication between controller hub 115 and switch 120. In one embodiment, multiple devices are capable of being coupled to switch 120.

Switch/bridge 120 routes packets/messages from device 125 upstream, i.e. up a hierarchy towards a root complex, to controller hub 115 and downstream, i.e. down a hierarchy away from a root controller, from processor 105 or system memory 110 to device 125. Switch 120, in one embodiment, is referred to as a logical assembly of multiple virtual PCI-to-PCI bridge devices. Device 125 includes any internal or external device or component to be coupled to an electronic system, such as an I/O device, a Network Interface Controller (NIC), an add-in card, an audio processor, a network processor, a hard-drive, a storage device, a CD/DVD ROM, a monitor, a printer, a mouse, a keyboard, a router, a portable storage device, a Firewire device, a Universal Serial Bus (USB) device, a scanner, and other input/output devices. Often in the PCIe vernacular, such as device, is referred to as an endpoint. Although not specifically shown, device 125 may include a PCIe to PCI/PCI-X bridge to support legacy or other version PCI devices. Endpoint devices in PCIe are often classified as legacy, PCIe, or root complex integrated endpoints.

Graphics accelerator 130 is also coupled to controller hub 115 through serial link 132. In one embodiment, graphics accelerator 130 is coupled to an MCH, which is coupled to an ICH. Switch 120, and accordingly I/O device 125, is then coupled to the ICH. I/O modules 131 and 118 are also to implement a layered protocol stack to communicate between graphics accelerator 130 and controller hub 115. Similar to the MCH discussion above, a graphics controller or the graphics accelerator 130 itself may be integrated in processor 105.

Figure 2:
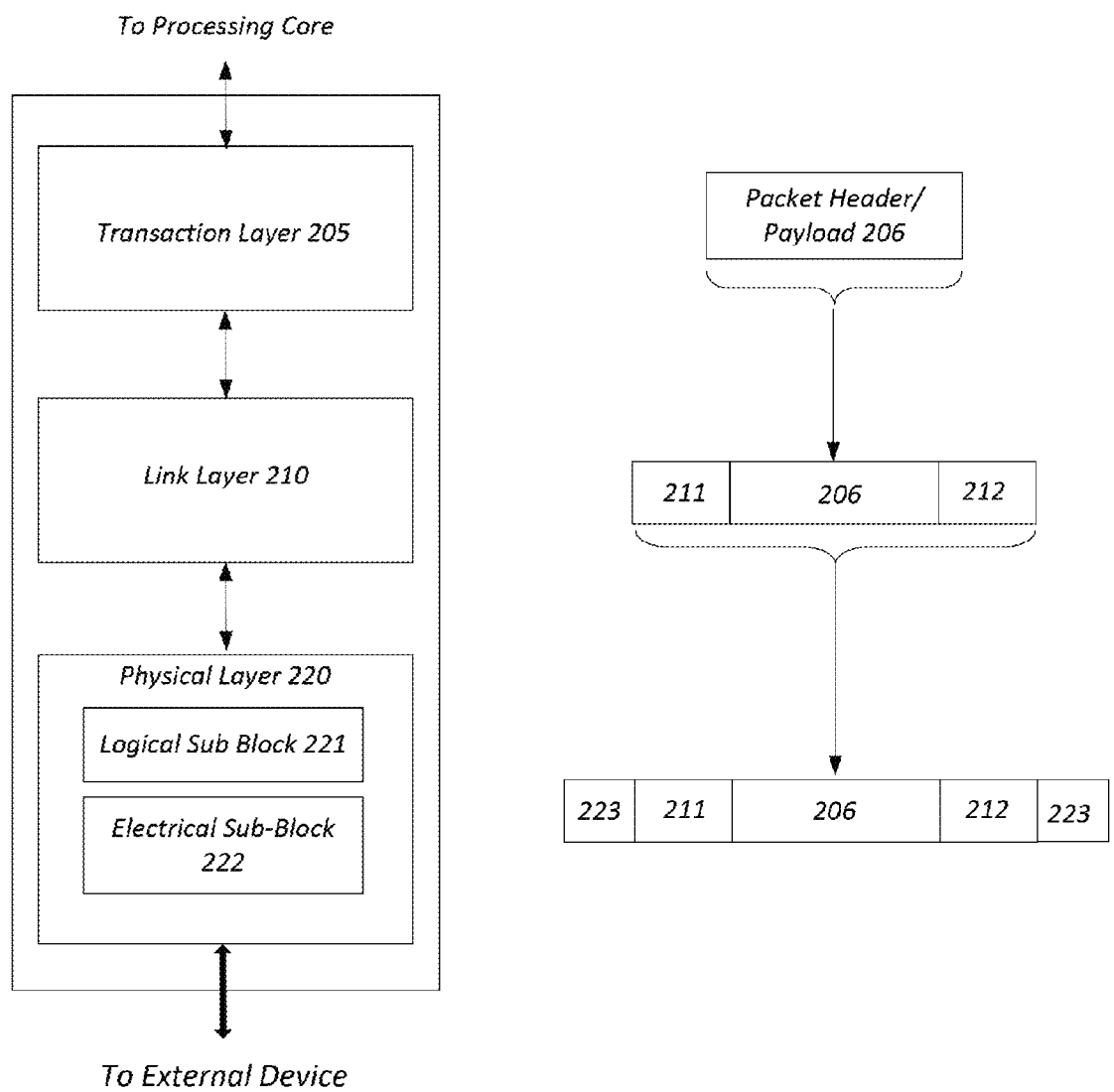
FIG. 2 illustrates an embodiment of a interconnect architecture including a layered stack.

Turning to FIG. 2 an embodiment of a layered protocol stack is illustrated. Layered protocol stack 200 includes any form of a layered communication stack, such as a Quick Path Interconnect (QPI) stack, a PCie stack, a next generation high performance computing interconnect stack, or other layered stack. Although the discussion immediately below in reference to FIGS. 1-4 are in relation to a PCIe stack, the same concepts may be applied to other interconnect stacks. In one embodiment, protocol stack 200 is a PCIe protocol stack including transaction layer 205, link layer 210, and physical layer 220. An interface, such as interfaces 117, 118, 121, 122, 126, and 131 in FIG. 1, may be represented as communication protocol stack 200. Representation as a communication protocol stack may also be referred to as a module or interface implementing/including a protocol stack.

PCI Express uses packets to communicate information between components. Packets are formed in the Transaction Layer 205 and Data Link Layer 210 to carry the information from the transmitting component to the receiving component. As the transmitted packets flow through the other layers, they are extended with additional information necessary to handle packets at those layers. At the receiving side the reverse process occurs and packets get transformed from their Physical Layer 220 representation to the Data Link Layer 210 representation and finally (for Transaction Layer Packets) to the form that can be processed by the Transaction Layer 205 of the receiving device.

Transaction Layer

In one embodiment, transaction layer 205 is to provide an interface between a device's processing core and the interconnect architecture, such as data link layer 210 and physical layer 220. In this regard, a primary responsibility of the transaction layer 205 is the assembly and disassembly of packets (i.e., transaction layer packets, or TLPs). The translation layer 205 typically manages credit-base flow control for TLPs. PCIe implements split transactions, i.e. transactions with request and response separated by time, allowing a link to carry other traffic while the target device gathers data for the response.

In addition PCIe utilizes credit-based flow control. In this scheme, a device advertises an initial amount of credit for each of the receive buffers in Transaction Layer 205. An external device at the opposite end of the link, such as controller hub 115 in FIG. 1, counts the number of credits consumed by each TLP. A transaction may be transmitted if the transaction does not exceed a credit limit. Upon receiving a response an amount of credit is restored. An advantage of a credit scheme is that the latency of credit return does not affect performance, provided that the credit limit is not encountered.

In one embodiment, four transaction address spaces include a configuration address space, a memory address space, an input/output address space, and a message address space. Memory space transactions include one or more of read requests and write requests to transfer data to/from a memory-mapped location. In one embodiment, memory space transactions are capable of using two different address formats, e.g., a short address format, such as a 32-bit address, or a long address format, such as 64-bit address. Configuration space transactions are used to access configuration space of the PCIe devices. Transactions to the configuration space include read requests and write requests. Message space transactions (or, simply messages) are defined to support in-band communication between PCIe agents.

Therefore, in one embodiment, transaction layer 205 assembles packet header/payload 206. Format for current packet headers/payloads may be found in the PCIe specification at the PCIe specification website.

Quickly referring to FIG. 3, an embodiment of a PCIe transaction descriptor is illustrated. In one embodiment, transaction descriptor 300 is a mechanism for carrying transaction information. In this regard, transaction descriptor 300 supports identification of transactions in a system. Other potential uses include tracking modifications of default transaction ordering and association of transaction with channels.

Transaction descriptor 300 includes global identifier field 302, attributes field 304 and channel identifier field 306. In the illustrated example, global identifier field 302 is depicted comprising local transaction identifier field 308 and source identifier field 310. In one embodiment, global transaction identifier 302 is unique for all outstanding requests.

According to one implementation, local transaction identifier field 308 is a field generated by a requesting agent, and it is unique for all outstanding requests that require a completion for that requesting agent. Furthermore, in this example, source identifier 310 uniquely identifies the requestor agent within a PCIe hierarchy. Accordingly, together with source ID 310, local transaction identifier 308 field provides global identification of a transaction within a hierarchy domain.

Attributes field 304 specifies characteristics and relationships of the transaction. In this regard, attributes field 304 is potentially used to provide additional information that allows modification of the default handling of transactions. In one embodiment, attributes field 304 includes priority field 312, reserved field 314, ordering field 316, and no-snoop field 318. Here, priority sub-field 312 may be modified by an initiator to assign a priority to the transaction. Reserved attribute field 314 is left reserved for future, or vendor-defined usage. Possible usage models using priority or security attributes may be implemented using the reserved attribute field.

In this example, ordering attribute field 316 is used to supply optional information conveying the type of ordering that may modify default ordering rules. According to one example implementation, an ordering attribute of "0" denotes default ordering rules are to apply, wherein an ordering attribute of "1" denotes relaxed ordering, wherein writes can pass writes in the same direction, and read completions can pass writes in the same direction. Snoop attribute field 318 is utilized to determine if transactions are snooped. As shown, channel ID Field 306 identifies a channel that a transaction is associated with.

Link Layer

Link layer 210, also referred to as data link layer 210, acts as an intermediate stage between transaction layer 205 and the physical layer 220. In one embodiment, a responsibility of the data link layer 210 is providing a reliable mechanism for exchanging Transaction Layer Packets (TLPs) between two components a link. One side of the Data Link Layer 210 accepts TLPs assembled by the Transaction Layer 205, applies packet sequence identifier 211, i.e. an identification number or packet number, calculates and applies an error detection code, i.e. CRC 212, and submits the modified TLPs to the Physical Layer 220 for transmission across a physical to an external device.

Physical Layer

In one embodiment, physical layer 220 includes logical sub block 221 and electrical sub-block 222 to physically transmit a packet to an external device. Here, logical sub-block 221 is responsible for the "digital" functions of Physical Layer 221. In this regard, the logical sub-block includes a transmit section to prepare outgoing information for transmission by physical sub-block 222, and a receiver section to identify and prepare received information before passing it to the Link Layer 210.

Physical block 222 includes a transmitter and a receiver. The transmitter is supplied by logical sub-block 221 with symbols, which the transmitter serializes and transmits onto to an external device. The receiver is supplied with serialized symbols from an external device and transforms the received signals into a bit-stream. The bit-stream is de-serialized and supplied to logical sub-block 221. In one embodiment, an 8b/10b transmission code is employed, where ten-bit symbols are transmitted/received. Here, special symbols are used to frame a packet with frames 223. In addition, in one example, the receiver also provides a symbol clock recovered from the incoming serial stream.

As stated above, although transaction layer 205, link layer 210, and physical layer 220 are discussed in reference to a specific embodiment of a PCIe protocol stack, a layered protocol stack is not so limited. In fact, any layered protocol may be included/implemented. As an example, an port/interface that is represented as a layered protocol includes: (1) a first layer to assemble packets, i.e. a transaction layer; a second layer to sequence packets, i.e. a link layer; and a third layer to transmit the packets, i.e. a physical layer. As a specific example, a common standard interface (CSI) layered protocol is utilized.

Referring next to FIG. 4, an embodiment of a PCIe serial point to point fabric is illustrated. Although an embodiment of a PCIe serial point-to-point link is illustrated, a serial point-to-point link is not so limited, as it includes any transmission path for transmitting serial data. In the embodiment shown, a basic PCIe link includes two, low-voltage, differentially driven signal pairs: a transmit pair 406/411 and a receive pair 412/407. Accordingly, device 405 includes transmission logic 406 to transmit data to device 410 and receiving logic 407 to receive data from device 410. In other words, two transmitting paths, i.e. paths 416 and 417, and two receiving paths, i.e. paths 418 and 419, are included in a PCIe link.

A transmission path refers to any path for transmitting data, such as a transmission line, a copper line, an optical line, a wireless communication channel, an infrared communication link, or other communication path. A connection between two devices, such as device 405 and device 410, is referred to as a link, such as link 415. A link may support one lane—each lane representing a set of differential signal pairs (one pair for transmission, one pair for reception). To scale bandwidth, a link may aggregate multiple lanes denoted by xN, where N is any supported Link width, such as 1, 2, 4, 8, 12, 16, 32, 64, or wider.

A differential pair refers to two transmission paths, such as lines 416 and 417, to transmit differential signals. As an example, when line 416 toggles from a low voltage level to a high voltage level, i.e. a rising edge, line 417 drives from a high logic level to a low logic level, i.e. a falling edge. Differential signals potentially demonstrate better electrical characteristics, such as better signal integrity, i.e. cross-coupling, voltage overshoot/undershoot, ringing, etc. This allows for better timing window, which enables faster transmission frequencies.

Traditional interconnect architectures, including PCI and PCIe were developed and standardized largely around the paradigm of traditional computing devices, such as personal computers (PCs), where chip-to-chip connections, plug and play, and componentized architectures were the norm. Newer technologies have emphasized smaller, more mobile computing, with smart phones, netbooks, laptops, and tablets complimenting desktop computers within the marketplace. Given the decreasing size and compact form factors of mobile computing devices, personal computers have become less modular. Where in the past it was relatively common to replace graphics cards, memory, and other components, accessing or upgrading the components of a smart phone, tablet, or other such device is uncommon. Indeed, in some markets, the expectation is that when an upgrade is needed, the owner trades-in or otherwise replaces a previous device with an entirely new device, where in years past, the owner may have tried to extend the lifespan of the device by upgrading individual components. In many modern systems, computing hardware is migrating from a modular model to an integrated one, with multiple components being integrated on a single board, or a system on chip (SoC).

Some believe that the trend toward integration is likely to make traditional I/O technologies obsolete, including existing interconnect architectures, as the purpose of I/O technology development shifts from enabling chip-to-chip connections towards enabling SoC intellectual property (IP) block (or "computing block") integration. An IP block can refer to a reusable unit of logic, circuitry, or chip layout. An SoC can include multiple IP blocks, including multiple instances of the same IP block. An IP block, in some instances, can support multiple functions, facilitated, in some cases, by one or multiple devices included in the IP block.

An SoC and corresponding I/O solutions can be provided in a variety of different computing devices, including tablets, phones, and other low cost embedded platforms, but also to current and next generation PCs, server systems, among other examples. A computing system, such as an SoC, can employ multiple integrated devices, such as multiple IP blocks. The computing system, in some implementations, can provide for runtime configuration, such as through an operating system or Basic I/O System (BIOS). For instance, at boot-up, BIOS can access registers (e.g., Base Address Registers (BARs) of the various devices) and initialize and test the system components. The BIOS can then pass information to the operating system based on its initialization operations.

A fabric agent's registers can be mapped to memory locations. For instance, a fabric agent's registers can reside in any one of memory mapped space, I/O mapped space, configuration space, etc. In memory mapped space, an address field can be the offset within the BAR indicated by the BAR Number field. In some instances, access to an agent's memory mapped space may be one of a 16- or 48-bit address, depending on the BAR size of the device. An agent's BAR numbers on sideband may or may not match its BARs on the primary interface. For I/O mapped space, the address field can be an offset within the BAR indicated by the BAR Number field and may or may not match its BARs on the primary interface. In configuration space, the address field can indicate the register offset and can be a 16-bit address field, among other example implementations.

Device drivers can use APIs provided by the operating system to access the configuration space of the device. Device addressing can be enabled by mapping the device into the system's I/O port address space or memory-mapped address space. The system's firmware, device drivers or the operating system can program the BARs to inform the device of its address mapping by writing configuration commands to a controller. In some cases, the devices may be in an inactive state upon system reset and not yet have addresses assigned to them by which the operating system or device drivers can communicate with them. In some cases, the BIOS or the operating system can be utilized to assign addresses to the BARs of the devices when the system is booted, among other examples.

In some implementations, an on-chip system fabric architecture can be defined for use in interconnecting blocks in an SoC. The fabric can provide a standardized interface to enable IP blocks to be shared across CPU, platform controller hub (PCH), and SoC products. This can allow IP blocks to be reused across a spectrum of CPU, PCH, and SoC products based on specific market needs. An IP block compliant with the fabric can connect to the fabric as an agent. A master interface of the agent can include master control signals that provide information to the fabric for flow control on the master interface, and arbitration and decoding of transactions. The information on the master control interface can be used by the fabric, and may sometimes be forwarded by the fabric to a fabric target interface. The master interface can also utilize command and data signals. The information on these signals can be forwarded by the fabric to the target command and data interfaces of the selected target agent. In addition to the command and data interfaces, the target interface also has a control interface that can carry flow control and decode information between the fabric target interface and the agent target interface.

A fabric can define a decode phase to be used to determine a target of a transaction. The decode phase is used to determine the target of a transaction. The fabric can use the decode phase to associate credits required by a particular transaction with the credits available by the decoded target, and to direct the put signal to the decoded target when a transaction has been granted in a command phase. Multiple transaction decode options can be supported including one or more of source decode, fabric decode, target decode, and subtractive decode.

Source decode can be supported in some implementations. With source decode, a fabric can be presented with information of the final destination of a transaction. The fabric receiving the transaction need not decode the command to identify the intended target. The decoded information can be conveyed via a Destination ID field. If an agent implements source decode, the agent can decode the target and present this information to the fabric using the Destination ID field on its master control and command interface. The destination information can be sent in the request phase to enable the fabric request arbiter to make routing decisions prior to seeing the command. The fabric can use this information to route the transaction to the destination.

In a multi-hop fabric, this information can be carried across fabrics, to the final fabric on which the eventual target is attached. For instance, an identified destination can be used as "source decode" information by the next fabric to route transactions without having to decode them again. For example, the upper-level fabric can present the Destination ID to the next hop fabric over a target command interface. If the destination agent is attached on another fabric below the current one, the transaction can be forwarded down to the other fabric, and so on until the final target (on the final fabric) is reached.

Fabric decode can also be supported in some implementations. In one example, a point-to-point connection, fabric-based decode is implicit. In a many-to-one fabric, it may also be implicit that the many agents all have the same target. However, if the target is not implicitly known, the fabric may first identify the corresponding transaction command in order to perform the decode. The fabric may acquire the command information, for instance, by using a special show command protocol in which agents expose their command attributes (e.g., of outgoing transactions) to the fabric without unloading commands from their queues. Alternatively, agents can accept an entire transaction into a store-and-forward buffer that gives the fabric access to the command. In either case, the fabric can maintain mirror or shadow copies of all configuration registers of the attached target agents in order for the fabric to perform the decode. The mechanism by which the shadow registers are programmed can be fabric specific. For instance, shadow registers can be programmed by either snooping the configuration transaction to the agent, using the sideband message interface to gather the required information during configuration and enumeration, or by using other fabric-specific mechanisms.

In some implementations, a fabric can identify a target based on the target's bus, device, and function number (as well as, in some cases, the target's root space identifier). To decode transactions involving a bridge, the fabric can additional maintain a shadow copy of the bridge's secondary and subordinate bus number registers. Indeed, the fabric can maintain shadow copies of BARs of endpoint agents, base and limit registers of bridges, and other registers, such as Memory Space Enable (MSE), IO Space Enable (IOSE), Power Management Power State, and Function Level Reset (FLR) registers of agents, among other examples.

Target decode can also be used by a fabric to decode transactions. With target decode, each target can implement a decoder for its own transactions and this capability may be used by the fabric for target-based decoding. If the target decode control signal is asserted by the fabric, then the agent decodes the transaction and asserts hit or subtractive hit N clock cycles later, provided it is the target of the transaction. An advantage of target decode is the ability to support fabric agent addition or removal with minimum changes to the fabric logic, although additional latency may be added, in some cases, to complete the decode cycle.

Figure 5:
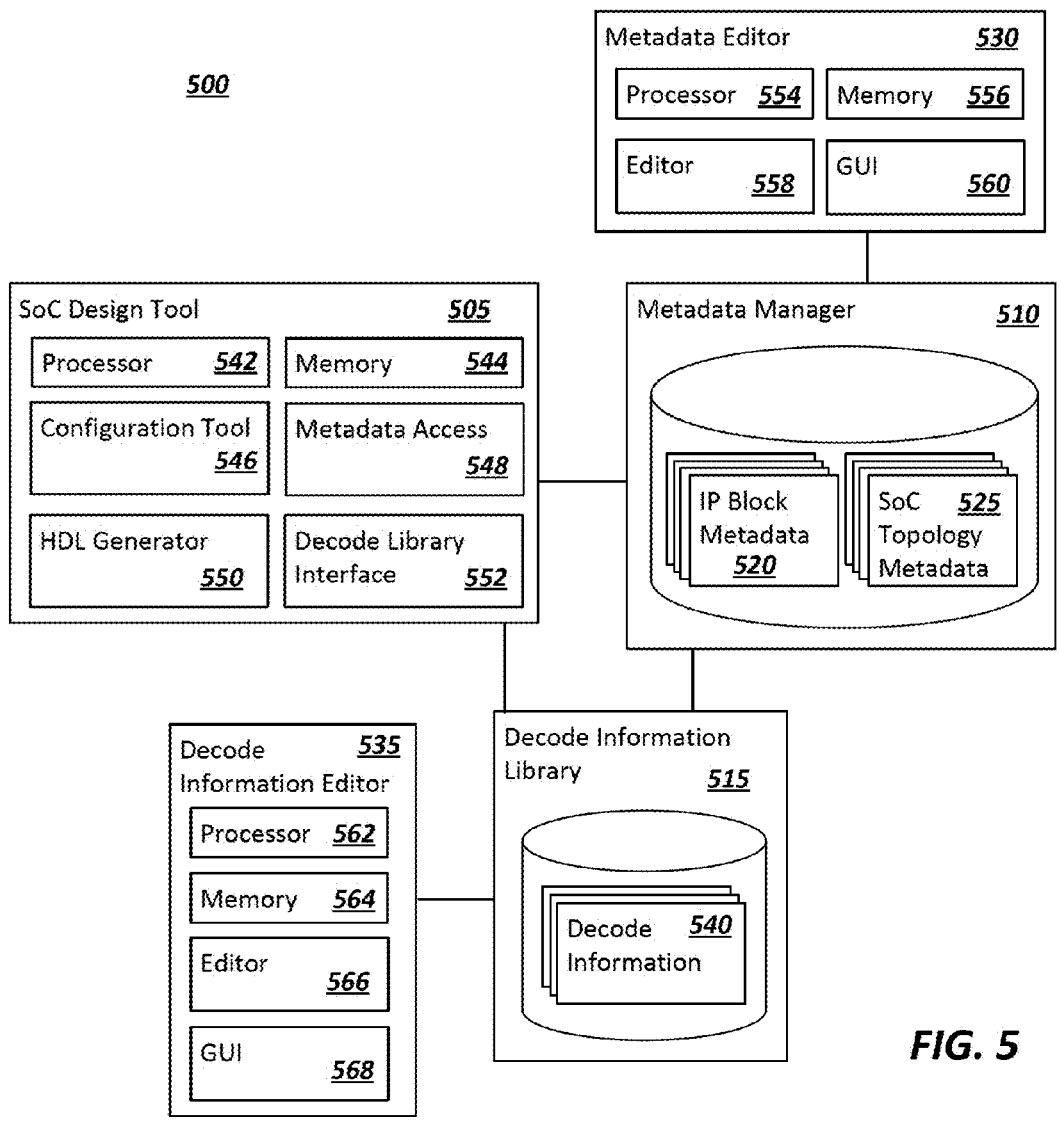
FIG. 5 illustrates a simplified block diagram representing an example system.

Turning to FIG. 5, a simplified block diagram 500 is shown illustrating an example system that can be used in the development of an SoC and SoC fabric. An SoC design tool 505 can be provided that is capable of generating a design abstraction of the SoC, for instance, using a hardware description language (HDL). To simplify use of the SoC design tool 505, and streamline the design and configuration of fabrics using the SoC design tool 505, a metadata manager 510 can be provided to interface with the SoC design tool 505 and maintain metadata 520, 525 defining fixed attributes of the subcomponents of potentially multiple SoC designs. A decode information library 515 can also be provided that includes multiple volumes, or entries 540, of potential decode information that can be included in and used in the generation of a particular fabric definition generated by the SoC design tool 505.

An SoC design tool 505 can be presented with information describing the topology and features of components of an SoC. The information can include decode information that might be required by the interconnect fabric of the SoC to decode the various IP blocks (and related transactions) that are to be connected to the fabric. Additional details can be provided to describe the interfaces between the fabric and the IP blocks, including the virtual channels supported by each IP block, the transactions and transaction sizes supported by each of these channels, the data bus width of the interfaces, the address bus width of the interfaces, among other information. This information can be used as the basis for determining (e.g., automatically using logic of the SoC design tool 505) the minimum buffer size settings for the SoC that will support the combination of IP blocks to be included in the SoC. The SoC design tool 505 can utilize this information to determine and generate a model of the SoC (e.g., during design time of the SoC). For instance, the model can be a HDL model that describes an SoC with the minimum configuration for guaranteeing functionality of the SoC with the desired topology and IP block combinations. Further information can also be presented to the SoC design tool for use in fine-tuning such a minimally functional model. For instance, the SoC design tool 505 can consume additional information describing performance requirements, quality service requirements, bandwidth characteristics, and other attributes of the individual IP blocks (or functions of the IP blocks). The SoC design tool 505 can be used to automatically adjust configuration of the SoC (i.e., upward from the determined minimum configuration) to meet these additional attributes.

In prior systems, to the extent SoC design tools have been available that are capable of generating a model of a functional SoC, providing the underlying information describing the SoC's topology and the characteristics of each included IP block has been a manual process. For instance, a team of human users may define hundreds of lines of SoC characteristics and provide these as inputs to the SoC design tool. This can be an extraordinarily expensive and time-consuming task. Further, manual definition of SoC characteristics risks typographical errors, in consistent definitions, and other human errors jeopardizing the efficacy of the effort.

In one implementation, a system can be provided to define files that describe reusable bundles of information, or metadata, describing characteristics of multiple different IP blocks. Select metadata files can be identified that correspond to instances of particular IP blocks that have been selected for inclusion within an SoC. Additional metadata can be defined that describes the specific topology to be adopted for the SoC. Such topology metadata can be linked to the IP block metadata files to describe a complete set of machine-parsable information that can be consumed by an SoC design tool 505 to generate a model of a functional configuration of the SoC described in the metadata files.

Decode information can also be predefined and can be provided to a library of decode information (e.g., 515) that can likewise be consumed by an SoC design tool 505, together with metadata files, to generate a software model of a particular SoC described in the metadata files. Decode information can include any information that might be required by the eventual fabric (generated from the HDL definition) to decode the various IP blocks (and related transactions) that are to be connected to the fabric. In some implementations, decode information and the decode information library 515 can adopt one or more features described in U.S. patent application Ser. No. 14/579,565, entitled "Decode Information Library" and filed on Dec. 22, 2014, which is herein incorporated by reference in its entirety.

In some implementations, a SoC design tool 505 can include one or more processors 542, one or more memory elements 544, and additional components, implemented in software and/or hardware, such as a configuration tool 546, metadata access interface 548, HDL generator 550, and decode library interface 552. The configuration tool 546 can consume IP block metadata 520 and SoC topology metadata 525 files and can parse the files to identify characteristics of the desired SoC and generate a model from these extracted characteristics. IP block metadata 520 can include links to decode information 540 in decode information library 515 that corresponds to the given IP block. In some instances, the IP block metadata can include decode information. Indeed, decode information entries 540 can be sourced, in some instances, from IP block metadata files 520.

One or more repositories can be provided to host metadata files 520, 525 and/or decode information entries 540. APIs can be provided (e.g., in connection with a metadata access interface 548 and decode library interface 552) to permit the configuration tool 546 to access and utilize the metadata files and decode information entries that correspond to IP blocks identified for connection to a fabric. Indeed, an SoC topology metadata file 525 can be accessed and can be parsed to identify the set of IP blocks that are to be included in the proposed SoC. The configuration tool 546 (or another component of the SoC design tool 505) can then identify and retrieve the IP block metadata files 520 and/or decode information entries 540 that correspond to the identified IP blocks. The configuration tool 546 can parse this data to identify further characteristics of the fabric. An HDL generator 550 can utilize this information as inputs for generating a model of a working configuration of the SoC, its IP blocks and fabric. In some cases the model can be provided as an abstraction of the SoC design embodied in one or more HDL objects that can be used to define the pre-silicon SoC.

In digital circuit design, HDLs can define design abstractions of circuits and on-chip systems to model the structure, design and operation of electronic circuits, including systems of circuits, such as would be implemented in a fabric or SoC. An HDL can enable a precise, formal description of an electronic circuit that allows for the automated analysis, simulation, and simulated testing of the modeled circuit. An HDL object, or "program," can be consumed by fabrication tools for use in generating the actual circuits modeled by the HDL object. For instance, an HDL program can be compiled (e.g., using tool 505 or another tool) into a lower level specification of physical electronic components, such as masks used to fabricate the modeled integrated circuit(s). Some SoC design tools (e.g., 505) can automate the generation of HDL objects, based on inputs provided to it that correspond to functionality and devices to be implemented on an SoC, including its fabric. HDLs can be used to write executable specifications for hardware and tools can be provided that can implement the underlying semantics of language statements within an HDL object to provide a hardware designer (or design tool) with the ability to model a corresponding piece of hardware (e.g., an SoC) before it is created physically (e.g., in silicon).

In one example, SoC design tool 505 (e.g., using configuration tool 546 or HDL generator 550) can generate a register-transfer level (RTL) HDL object. RTL is a design abstraction that can model a synchronous digital circuit in terms of the flow of digital signals (data) between hardware registers, and the logical operations performed on those signals. RTL can be used in some HDLs to create high-level representations of a circuit, from which lower-level representations and ultimately actual wiring can be derived. An RTL HDL object can model circuit elements including registers and combinational logic. Registers (e.g., implemented as flip-flops) can synchronize the circuit's operation to the edges of the clock signal, and implement memory properties for the circuit. Combinational logic can provide the logical functions in the circuit (e.g., as implemented through corresponding logic gates), among other examples. An electronic design automation (EDA) tool can consume the description provided through an HDL object to translate the object into an equivalent hardware implementation file for use in designing and fabricating the corresponding integrated circuits (e.g., of an SoC).

In some examples, a metadata editor 530 can be provided to allow a user or organization to define metadata for a particular SoC topology and/or IP block. The metadata editor 530 can include one or more processors 554, one or more memory elements 556, and additional components implemented in hardware and/or software to implement functionality of the metadata editor 530. Such components can include, for instance, an editor 558 and graphical user interface (GUI) 560 to allow users to interface with the editor 558. In some instances, the multiple instances of a metadata editor 530 can be provided to multiple IP block vendors to allow the vendors to define an IP block metadata file for each IP block they produce. In other instances, the metadata editor 530 can be provided as a service, such as a web-based or SOA service allowing various entities to access and utilize the metadata editor 530 to create, edit, and modify IP block metadata files 520 for corresponding IP blocks. A metadata editor 530 can also be used to allow one or more users to interact with the editor 558 via GUI 560 to define an SoC topology metadata file 525.

In some implementations, a decode information editor 535 can be provided to allow a user to interface with decode information library 515, define decode information to associate with IP blocks in particular instances of a fabric, and even edit the decode information 540. For instance, associations between a particular IP block and one or more library entries can be defined, library entries can be edited, new entries (including custom entries) can be generated, among other tasks. In one example, a library editor 535 can include one or more processor devices 562, one or more memory elements 564, and one or more components implemented in software and/or hardware can be provided that facilitate functionality of the library editor 535. For instance, an editor 566 can be provided to edit or generate library entries, among other functionality. Further, a graphical user interface (GUI) 568 can be provided allowing users to interact with the decode information library 515.

Figure 6:
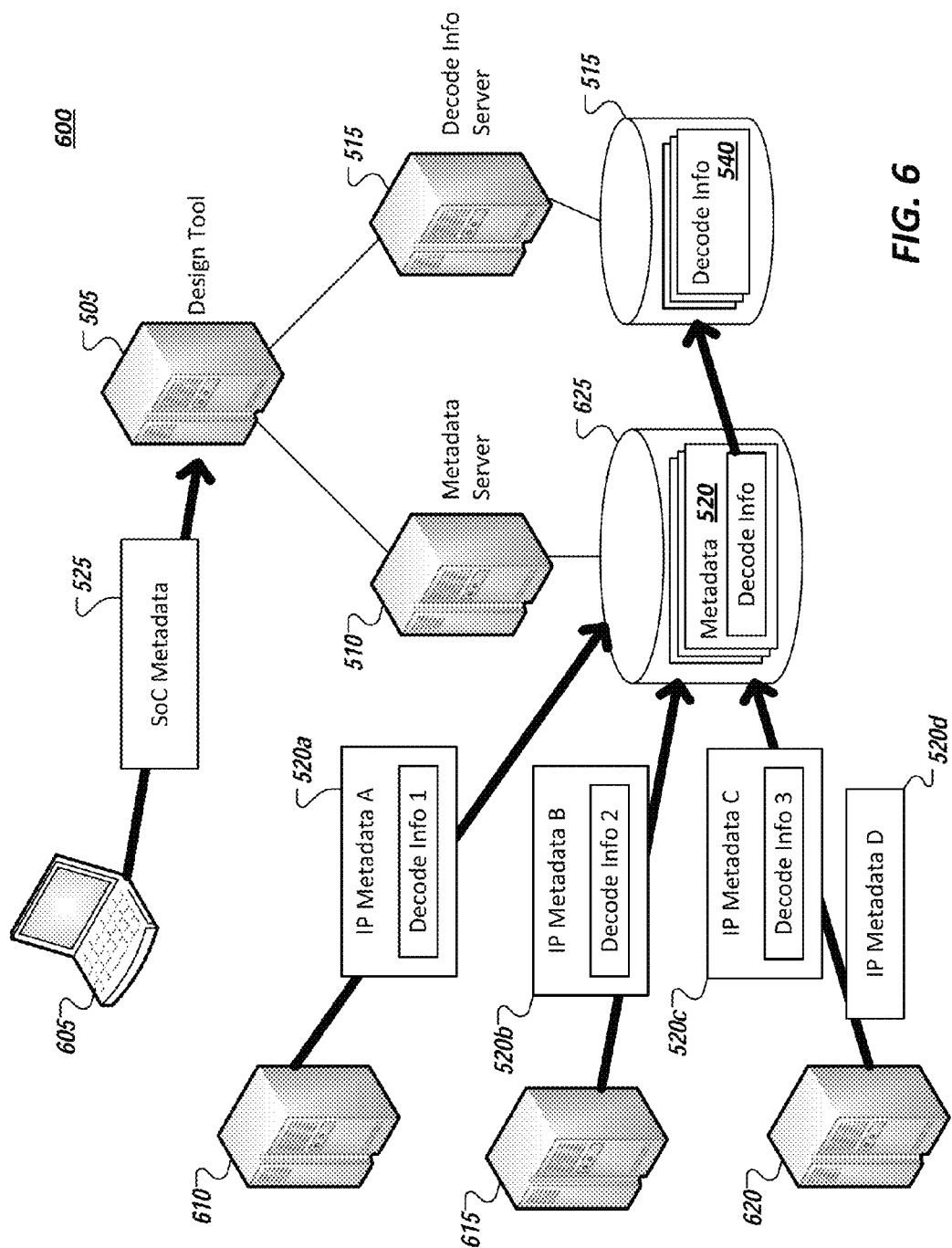
FIG. 6 illustrates a simplified block diagram representing an example system including an example design tool using topology and computing block metadata files.

Turning to FIG. 6, a simplified block diagram 600 is shown illustrating an example system including an SoC design tool 505, metadata manager server 510, and decode information library server 515. As noted above, reusable metadata files (e.g., 520, 525) and decode information entries 540 can be created from a variety of sources (e.g., 605, 610, 615, 620). For instance, an SoC can be planned that is to incorporate one or more instances of several different IP blocks provided by one or more different vendors. For instance, an IP block metadata file 520*a* can be defined and provided (e.g., over a network) by a first entity (corresponding to source 610) that is responsible for providing a corresponding IP block A. Similar IP block metadata files 520*b*, 520*c*, 520*d* can be provided by other sources 615, 620 responsible for providing corresponding IP blocks B, C, and D. In some cases, a single entity and source (e.g., 620) can provide multiple IP blocks (e.g., blocks B and C) and corresponding metadata files (e.g., 520*c*, 520*d*). The sources and entities can generate their IP block metadata files using instances of a metadata editor. Metadata files 520*a-d* can be provided for access and re-use in a metadata repository 625 or may come bundled with the corresponding IP block at delivery time. For instance, many characteristics of an IP block can be static, including those characteristics that are relevant to configuring an SoC. Further, multiple SoCs and other systems may make use of instances of the same IP block. Further, these various systems may all be modeled by a design tool 505. Accordingly, the same IP block metadata file can be used to generate two distinct models of two different systems that happen to employ instances of a same IP block corresponding to the IP block metadata file.

As noted above, in some implementations, a fabric of an SoC may be configured to support runtime decoding of transactions and corresponding configuration space of IP blocks implemented on the SoC. In these and other examples, a decode information library 515 may also be used by the design tool 505 to generate an HDL model of an SoC that incorporates a particular set of IP blocks connected to a fabric to be implemented on the SoC. In some cases, IP block metadata can include decode information specific to devices and functions implemented on that IP block. In some implementations, the library of decode information 515 can be queried to determine whether decode information included in a particular IP block metadata file (e.g., 520*a-c*) is already included in the library 515. In some cases, the decode information included in an IP block metadata file (e.g., 520*a-c*) can be extracted to generate a new corresponding entry in decode information library 515. An IP block metadata file may include pointers to entries in the library that incorporate decode information relevant to the IP block described in the IP block metadata file. Indeed, in some cases, an IP block metadata file (e.g., 520*d*) may simply point to an existing entry 540 in decode information library 515 in lieu of describing the decode information relevant within the body of the IP block metadata file (e.g., 520*d*). In either instance, the design tool 505 can programmatically identify the appropriate decode information entries 540 that map to IP block metadata files and corresponding IP blocks to be included in a particular SoC design. The decode information entries can be used with the IP block metadata files to generate an HDL model of a functional version of the SoC.

An SoC topology metadata file 525 can also be defined for a particular implementation of an SoC. For instance, a user can utilize a personal computing device 705 running an instance of a metadata editor to define an SoC topology metadata file 525 that describes the topology of a desired SoC. Such a metadata file may also be reusable (e.g., for different versions of a similar SoC) and can be used by the SoC design tool together with IP block metadata files 520 and decode information entries 540 to generate an HDL model of the SoC. An SoC topology metadata file 525 can define which IP blocks are to be included in the SoC, the fabric and fabric devices that are to be used to interconnect the IP blocks, as well as other higher level details describing the overall SoC topology. For instance, SoC topology metadata can identify the override the types of the ports, the size of buffers in the fabric (e.g., above the minimum required for functionality), PCI device (and/or function) numbers, the specific port number of the fabric that the IP block should be placed on (e.g., in instances where the fabric uses port numbers in its arbitration scheme (e.g., where higher port number corresponds to higher priority), channel mapping information (e.g., defining how an IP block's channels map to the fabric/systems channels, P2P information (e.g., defining which IPs can talk to other IPs in addition to system memory)), identification of the port that is the subtractive port of the fabric, decoder location information, internal data path widths of fabric segments, among other information.

Figure 7A:
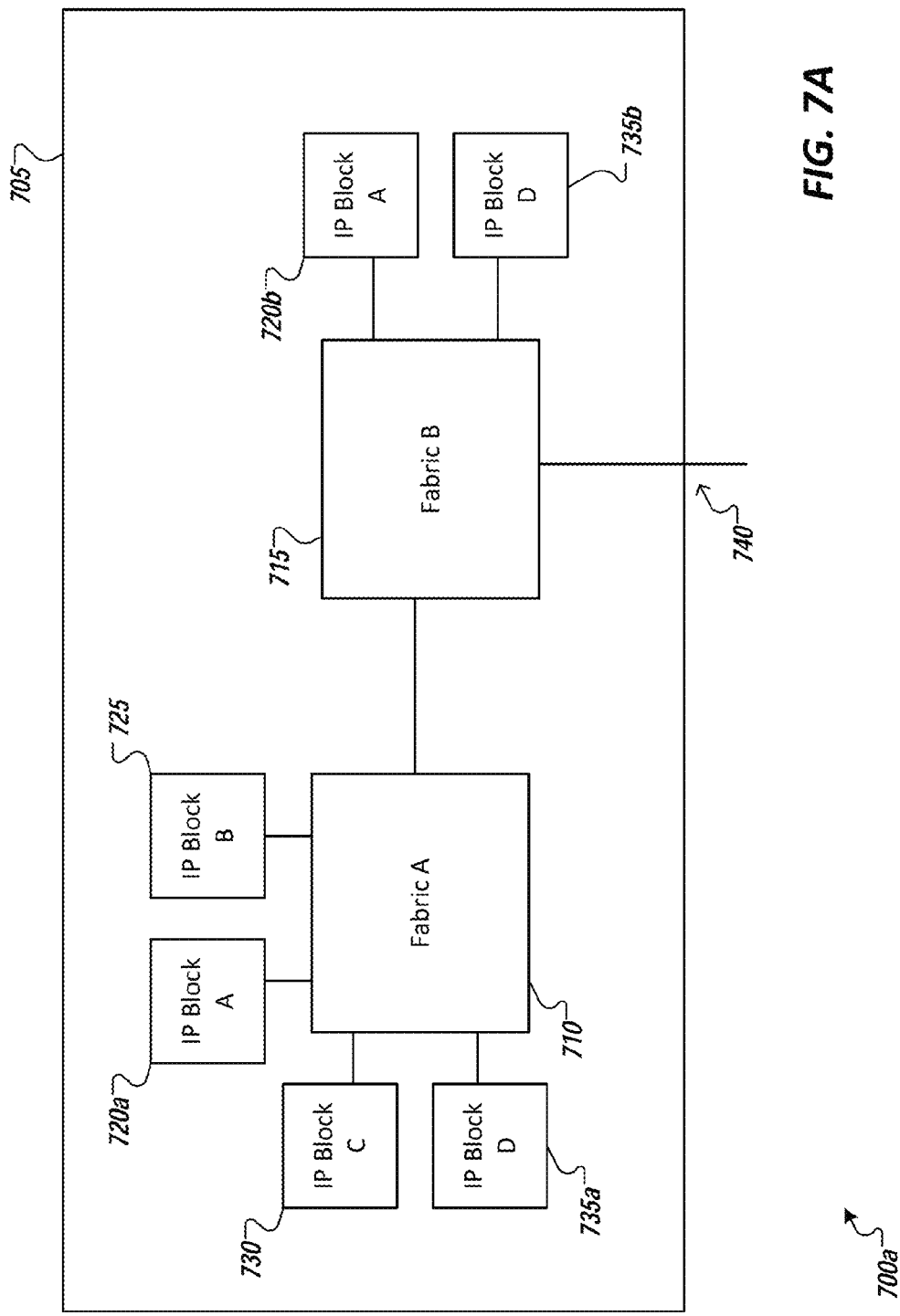
FIG. 7A illustrates a representation of an example of at least a portion of an example system-on-chip topology.

Turning to FIG. 7A, a simplified block diagram 700*a* is shown representing a simplified example of an SoC 705 topology. In this illustrative example, a fabric can be implemented using two fabric devices 710, 715 that may implement one or more fabric elements for use in routing transactions between IP blocks 720*a*, 720*b*, 725, 730, 735*a*, 735*b*. For instance, in the topology illustrated in the example of FIG. 7A, IP block A (720*a*), IP block B (725), IP block C (730), and IP block D (735) can each be connected to a respective port of fabric device A (710). Another instance of IP block A (720*b*) and another instance of IP block D (735*b*) can be connected to respective ports of fabric device B (715). Additionally, the fabric can provide for connections to other devices external to the SoC (e.g., at port 740) as well as to a coherent fabric that contains connections to CPUs and DRAM.

Figure 7B:
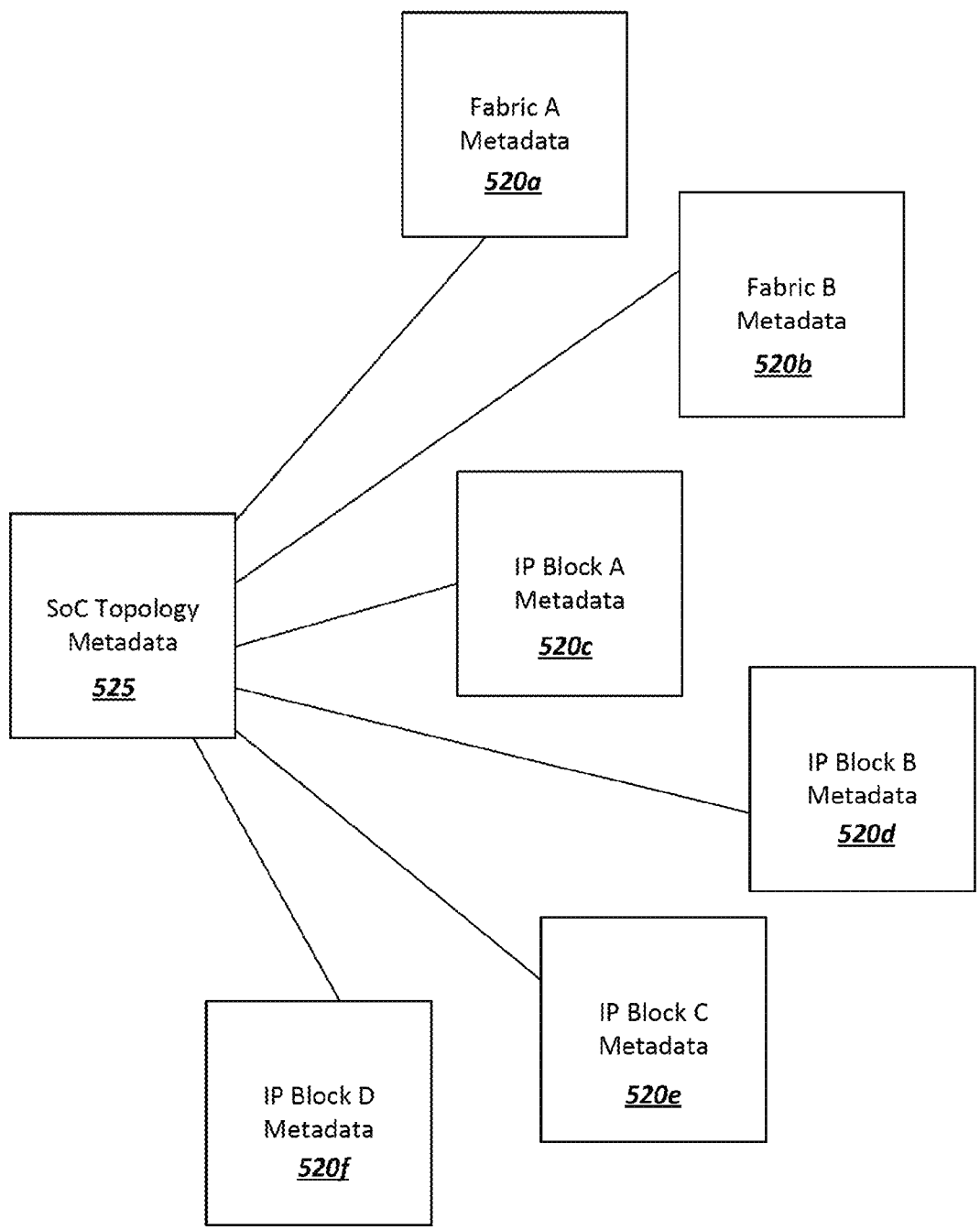
FIG. 7B illustrates a representation of relationships between a topology metadata file and computing block metadata files corresponding to the example system-on-chip topology illustrated in FIG. 7B.

As shown in the simplified block diagram 700*b* of FIG. 7B, an SoC topology metadata file 525 can be defined to describe the example topology illustrated in FIG. 7A. Further, a set of metadata files 520*a-f* can be identified and used together with the SoC topology metadata files to organize all of the information needed to define a configuration of the SoC that would meet minimum requirements for providing a functioning version of the SoC. In some implementations, the SoC topology metadata file 525 can identify each of the IP blocks to be included in the SoC and further provide links to the IP block metadata files 520*a-f* corresponding to set of IP blocks.

Each IP block (e.g., 720*a*, 720*b*, 725, 730, 735*a*, 735*b*) can be connected to a respective port of the fabric. Each port interface can be associated with the IP block metadata corresponding to the IP block to be attached to the port. The IP block metadata can include device information such as the number of channels (e.g., virtual channels) supported by the IP block interface, the types of transactions supported, the maximum transaction sizes supported for each of the channel-transaction type combinations, the data bus width, and the address bus width of the interface, among other examples. For instance, IP block metadata can include information relating to how an IP block performs channel mapping, bus interface optional signals that the IP block supports, widths of mandatory signals that permit bus width configuration, and so on. This information can be used, for instance, to determine per channel size maximums as well as minimum buffer size settings of the fabric.

The IP block metadata for an IP block can further reference or provide one or more entries in a library of decode information and the referenced decode information entries can be likewise associated with the port. In some instances, each entry of the library decode information can correspond to a respective function supported by the IP device. The functions can include defined functions within a protocol. An IP block can also include one or more distinct devices, each device configured to support one or more respective functions. For instance, a set of defined PCI/PCIe functions can be defined for a fabric supporting a PCI-based protocol.

Various different IP blocks may include circuitry and logic to perform one or more of the same functions and can each be associated with a corresponding decode information library entry. Accordingly, the functions of an IP block can be defined, at least in part, through the designated decode information entries defined as associated with the IP block in the IP block's corresponding metadata file. Decode information can include such information as the supported transaction types of a function, characteristics of associated configuration space (e.g., corresponding BARs), and other function information. This information can be used by an SoC design tool to define configuration of the fabric such that decoding of transactions involving the IP blocks can be supported. For instance, decode information can be used to define the provision of memory and/or flip flops in the fabric to accommodate shadow or mirror registers of the corresponding device or function of the IP block to be connected to the port, among other examples.

For instance, each entry can include all of the decode information that would be needed by a fabric to decode transactions for a particular device. In other words, each entry can correspond to a respective pre-defined device. Various IP blocks can each implement the same device and thus utilize the same corresponding entry in the decode information library. Alternatively, each decode information library entry can correspond to one of a set of pre-defined functions. For instance, a set of defined PCI/PCIe functions can be defined for a fabric supporting a PCI-based protocol. Various different IP blocks may include circuitry and logic to perform one or more of the same functions and can each be associated with a corresponding decode information library entry.

For instance, a particular IP block, IP block "A", can be a block provided by a particular entity and the block can be configured to perform two distinct functions within a set of defined functions. Accordingly, corresponding IP block metadata can identify a first decode information library entry that corresponds to a first one of the two functions supported by IP block "A" and can further identify another pre-defined decode information entry that corresponds to the second function. The first decode information entry can include all of the decode information that would be needed in a particular implementation of a fabric to decode transactions for that function. Similarly, the other entry can include a sufficient collection of decode information to allow the fabric to decode transactions for the second function.

In some cases, multiple instances of the same IP block can be included in a single SoC. Each instance of the IP block (e.g., 720*a*, 720*b* and 735*a*, 735*b*) can be described by the same IP block metadata file and can reference the same two decode information entries in the decode library, such that the respective port to which each instance of the IP block is to be connected is associated with the device information and decode information described or referenced in the IP block metadata file. Accordingly, rather than manually defining the information and decode information separately for each instance of the IP block, an SoC design tool can simply access the same IP block metadata files and decode information libraries for each instance of the IP block.

As shown in FIG. 7A, fabric devices 710, 715, such as routers, can be provided and can each be connected to multiple IP blocks. In some implementations, an SoC design tool can develop hierarchical associations between the configuration attributes of individual IP block devices and the fabric devices to which they are connected. For instance, one branch of a hierarchy can correspond to device Fabric A 710 and the set of IP blocks 720*a*, 725, 730, 735*a* connected to that portion of the fabric. Ports of fabric device 710 can be associated with the configuration information for the respective IP block (e.g., 720*a*, 725, 730, or 735*a*) connected to it. Accordingly, the configuration of fabric device 710 can be based on the set of IP blocks 720*a*, 725, 730, 735*a*. Likewise, fabric device 715 can be connected to its own set of IP blocks (e.g., 720*b*, 735*b*) and the configuration of fabric device 715 can be based on the set of configuration information identified for the set of IP blocks 720*b*, 735*b* from corresponding IP block metadata files. Still further, some fabric devices (e.g., 710, 715) can be connected to one or more other fabric devices. In such instances, a connection to another fabric device can cause at least a portion of the configuration information of one fabric device to be recursively associated with the other fabric device. For instance, from a decode perspective, the fabric at the top of a hierarchy (i.e., closest to the CPU) can utilize information related to other IP blocks on other segments of the hierarchy. This information can be recursively inherited across the fabric segments so that IP blocks on one fabric segment can send data to IP blocks on another segment and have them successfully reach their destination (e.g., by ensuring that channel mapping, channel counts, transaction sizes, and other information are propagated across the fabric).

As noted above, configuration attributes of IP blocks included in corresponding IP block metadata files can provide sufficient information to define the minimum buffer settings and other settings of the SoC necessary to bring the modeled SoC into minimally functional condition. In some implementations, IP block metadata files can include still additional information describing other characteristics of the corresponding IP block. As an example, performance and quality of service (QoS) targets of the IP block can be identified. For instance, the IP block metadata can identify an amount of sustained bandwidth to be guaranteed or provisioned for the IP block, a specific minimum latency guarantee, among other examples. These additional configuration attributes can be used by an SoC design tool to improve upon the minimum requirements for an operational version of the SoC determined from other attributes included in the corresponding metadata files.

In some instances, IP block metadata files and topology metadata files can be required to include a baseline amount of information such that the minimum operational version of the SoC can be modeled using an SoC design tool. In some implementations, attributes such as performance and QoS attributes of the various IP blocks and topology can be optional in that they provide an SoC design tool with attributes that allow the SoC to generate a model beyond a minimally functional configuration. In some instances, any of the metadata files used to describe a proposed SoC can be edited (e.g, by an authorized entity or user) to provide additional attributes of an individual IP block, fabric, or topology. This can allow an SoC design to be iteratively improved as new attributes are determined, with the SoC design tool generating a new version of the SoC model based on the set of metadata files modified with the additional information.

Turning to FIGS. 8A-8C, portions 800a-c of one or more example metadata files are presented for purposes of illustrating one or more examples. For instance, the portion 800a in FIG. 8A can illustrate a portion of an SoC topology metadata file. The topology metadata file can be compliant with a defined syntax for SoC topology metadata files, such that the topology metadata file can be provided to and parsed by an SoC design tool to determine the SoC topology from the topology metadata. In such examples, metadata files can be created and originate from a diverse range of sources so long as they adopt one of the set of supported syntaxes of the SoC design tool.

Continuing with the example of FIG. 8A, the portion 800a of the SoC topology metadata file shown in this example can include a definition of the IP blocks (e.g., "pcie", "cunit", "p2sb", "spi", "pmc") and fabric components (e.g., "psf1", "psf2") that a designer desires to be included in a topology of a planned SoC. The metadata file can also define the relationships and connections between the components. For instance, according to the syntax adopted in this particular implementation, an SoC design tool can parse the metadata to identify that fabric devices "psf1" is connected to "psf2" and that IP block "pcie" is connected to "psf1" and IP blocks "cunit", "p2sb", "spi", and "pmc" are connected to "psf2". Further, higher level (e.g., SoC or fabric-level) attributes can also be specified in the SoC topology metadata. As an example, topology metadata can designate function or device identifiers so as to uniquely identify multiple instances of a device/function combination. For instance, the interconnect of the desired SoC can adopt naming parameters based on the combination of a bus, device, and function number. These naming attributes can be defined (and modified) in some implementations, through the SoC topology metadata file.

SoC topology metadata can identify, for each of the designated IP blocks (or fabric devices) to be included in the SoC, a type of the component. A corresponding IP block metadata file can be provided for each type of component, such that the designation of a block's type can be used by the SoC design tool to identify and access a corresponding IP block metadata file to configure corresponding ports of the fabric based on information included in the IP block metadata file. For instance, an IP block "spi" can be of a type "SPI", block "cunit" can be type "CUNIT", IP block "pcie" can be of type "SPA". In other words, each named block can be an instance of a class of IP blocks (e.g., "pcie" is an instance of IP block type "SPA"). For instance, an IP block metadata file can be identified for block type "SPA" and can be used for IP block instance "pcie" by the SoC design tool. SoC topology metadata, such as shown in FIG. 8A, can also specify how IP blocks' channels are to be mapped. For instance, an IP block "PCIe" can be defined to map its channels to a channel named "VC0b," an IP block "psf1" can be constrained to two channels mapped to channels "VC0b" and "VC1b," and so on. Entries without a channel map entry may map their channels to default channels, among other examples.

Turning to FIG. 8B, a portion 800b of an IP block metadata file is shown for an IP block of type "SPA_01". An IP block metadata file can be used to define attributes of instances of the corresponding IP block. The IP block metadata file can be according to a syntax parsable by an SoC design tool, such that the attributes of the IP block instances can be automatically identified by the SoC design tool. The attributes described can include such examples as the number of channels (e.g., virtual channels) of an interface of the IP block (e.g., as defined by attribute NUM-CHAN), the maximum payload sizes supported by the IP block (e.g., the Ma_Payload_Size attribute), the length each request type of each channel (e.g., the CH0_P_MSTDATALENMax attribute describing a max length for posted-type requests on channel 0, etc.), among other examples.

An IP block metadata file can include references to decode information for devices and/or functions of the corresponding IP block. In some implementations, the IP block metadata file can include references or links to pre-defined entries in a library of decode information. In other instances, the IP block metadata file can include a version of the decode information. Indeed, decode information included in an IP block metadata file can serve as the source from which new entries are defined and added to the library of decode information. Each entry can be referenced-to and reused for other IP blocks that support the same corresponding features, among other examples. In the example of FIG. 8B, a parameter FunctionList can define the functions supported by instances of the metadata's corresponding IP block type. For instance, in the example of FIG. 8B, instances of IP block type "SPA_01" can support functions "SPA_01_2", "SPA_01_1", and "SPA_01_0". An SoC design tool, when parsing this portion of the IP block metadata data file for an instance of an "SPA_01" IP block can identify the three supported functions and attempt to identify whether the decode information for these functions is already included in entries of a decode information library and/or the body of the IP block metadata file. The SoC design tool can then reference this decode information to determine further characteristics of an SoC that supports the decoding of transactions related to these functions as provided by the corresponding IP block instance.

In the present example, as illustrated in FIG. 8C, the decode information of one or more of the functions of the "SPA_01" IP block can be included in the corresponding IP block metadata file. For instance, the portion 800c illustrated in FIG. 8C can be a portion of the decode information for a function "SPA_01_01". As illustrated, the decode information can include information for use in supported the decoding of the function's transactions. For instance, decode information can describe BAR sizes and types, offsets, supported header types, the transactions that are supported (i.e., that have been enabled), among other details.

Note that the apparatus', methods', and systems described above may be implemented in any electronic device or system as aforementioned. As specific illustrations, the figures below provide exemplary systems for utilizing the invention as described herein. As the systems below are described in more detail, a number of different interconnects are disclosed, described, and revisited from the discussion above. And as is readily apparent, the advances described above may be applied to any of those interconnects, fabrics, or architectures.

Figure 9:
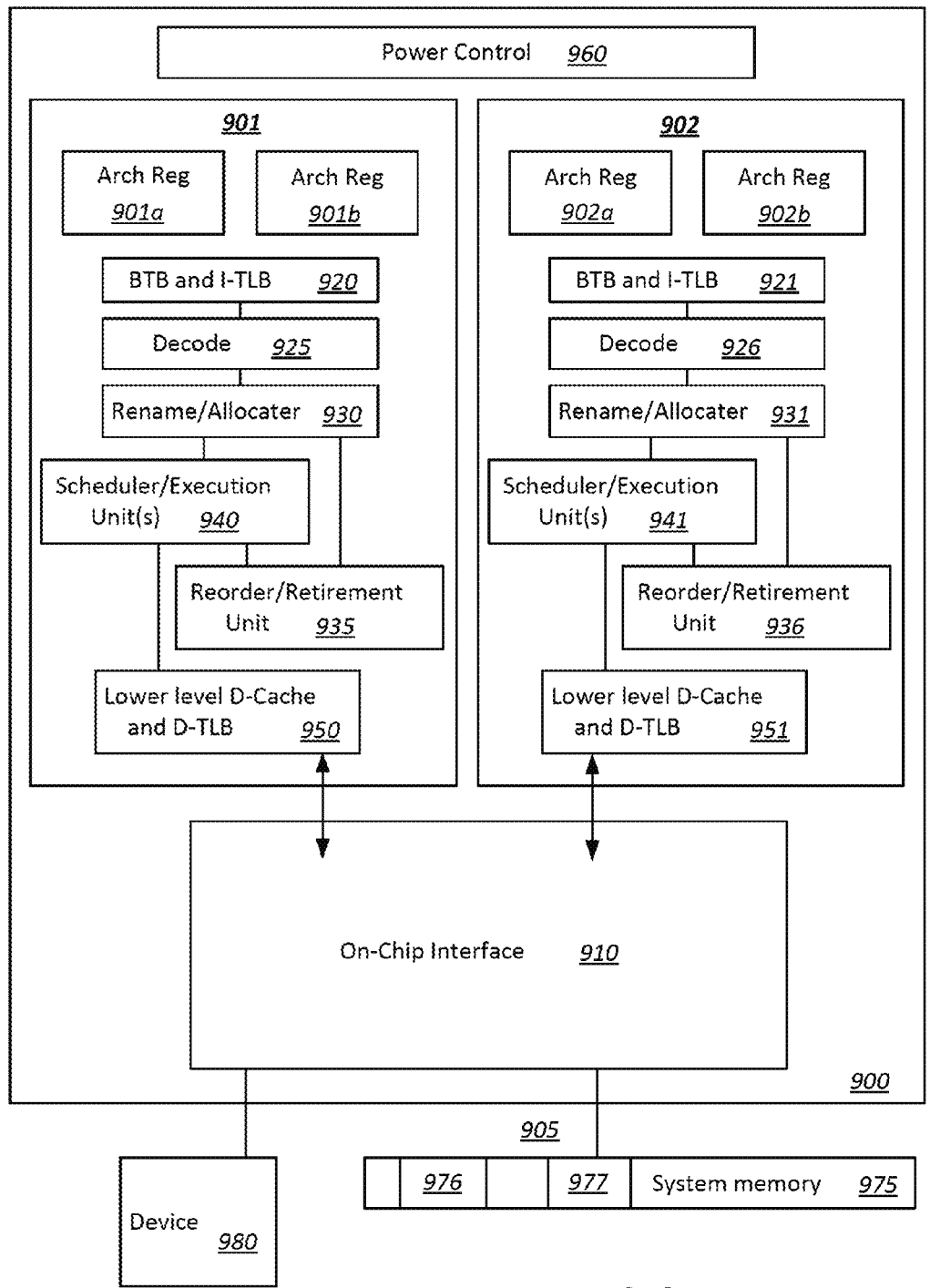
FIG. 9 illustrates an embodiment of a block diagram for a computing system including a multicore processor.

Referring to FIG. 9, an embodiment of a block diagram for a computing system including a multicore processor is depicted. Processor 900 includes any processor or processing device, such as a microprocessor, an embedded processor, a digital signal processor (DSP), a network processor, a handheld processor, an application processor, a co-processor, a system on a chip (SOC), or other device to execute code. Processor 900, in one embodiment, includes at least two cores—core 901 and 902, which may include asymmetric cores or symmetric cores (the illustrated embodiment). However, processor 900 may include any number of processing elements that may be symmetric or asymmetric.

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core often refers to logic located on an integrated circuit capable of maintaining an independent architectural state, wherein each independently maintained architectural state is associated with at least some dedicated execution resources. In contrast to cores, a hardware thread typically refers to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

Physical processor 900, as illustrated in FIG. 9, includes two cores—core 901 and 902. Here, core 901 and 902 are considered symmetric cores, i.e. cores with the same configurations, functional units, and/or logic. In another embodiment, core 901 includes an out-of-order processor core, while core 902 includes an in-order processor core. However, cores 901 and 902 may be individually selected from any type of core, such as a native core, a software managed core, a core adapted to execute a native Instruction Set Architecture (ISA), a core adapted to execute a translated Instruction Set Architecture (ISA), a co-designed core, or other known core. In a heterogeneous core environment (i.e. asymmetric cores), some form of translation, such a binary translation, may be utilized to schedule or execute code on one or both cores. Yet to further the discussion, the functional units illustrated in core 901 are described in further detail below, as the units in core 902 operate in a similar manner in the depicted embodiment.

As depicted, core 901 includes two hardware threads 901a and 901b, which may also be referred to as hardware thread slots 901a and 901b. Therefore, software entities, such as an operating system, in one embodiment potentially view processor 900 as four separate processors, i.e., four logical processors or processing elements capable of executing four software threads concurrently. As alluded to above, a first thread is associated with architecture state registers 901a, a second thread is associated with architecture state registers 901b, a third thread may be associated with architecture state registers 902a, and a fourth thread may be associated with architecture state registers 902b. Here, each of the architecture state registers (901a, 901b, 902a, and 902b) may be referred to as processing elements, thread slots, or thread units, as described above. As illustrated, architecture state registers 901a are replicated in architecture state registers 901b, so individual architecture states/contexts are capable of being stored for logical processor 901a and logical processor 901b. In core 901, other smaller resources, such as instruction pointers and renaming logic in allocator and renamer block 930 may also be replicated for threads 901a and 901b. Some resources, such as re-order buffers in reorder/retirement unit 935, ILTB 920, load/store buffers, and queues may be shared through partitioning. Other resources, such as general purpose internal registers, page-table base register(s), low-level data-cache and data-TLB 915, execution unit(s) 940, and portions of out-of-order unit 935 are potentially fully shared.

Processor 900 often includes other resources, which may be fully shared, shared through partitioning, or dedicated by/to processing elements. In FIG. 9, an embodiment of a purely exemplary processor with illustrative logical units/resources of a processor is illustrated. Note that a processor may include, or omit, any of these functional units, as well as include any other known functional units, logic, or firmware not depicted. As illustrated, core 901 includes a simplified, representative out-of-order (OOO) processor core. But an in-order processor may be utilized in different embodiments. The OOO core includes a branch target buffer 920 to predict branches to be executed/taken and an instruction-translation buffer (I-TLB) 920 to store address translation entries for instructions.

Core 901 further includes decode module 925 coupled to fetch unit 920 to decode fetched elements. Fetch logic, in one embodiment, includes individual sequencers associated with thread slots 901a, 901b, respectively. Usually core 901 is associated with a first ISA, which defines/specifies instructions executable on processor 900. Often machine code instructions that are part of the first ISA include a portion of the instruction (referred to as an opcode), which references/specifies an instruction or operation to be performed. Decode logic 925 includes circuitry that recognizes these instructions from their opcodes and passes the decoded instructions on in the pipeline for processing as defined by the first ISA. For example, as discussed in more detail below decoders 925, in one embodiment, include logic designed or adapted to recognize specific instructions, such as transactional instruction. As a result of the recognition by decoders 925, the architecture or core 901 takes specific, predefined actions to perform tasks associated with the appropriate instruction. It is important to note that any of the tasks, blocks, operations, and methods described herein may be performed in response to a single or multiple instructions; some of which may be new or old instructions. Note decoders 926, in one embodiment, recognize the same ISA (or a subset thereof). Alternatively, in a heterogeneous core environment, decoders 926 recognize a second ISA (either a subset of the first ISA or a distinct ISA).

In one example, allocator and renamer block 930 includes an allocator to reserve resources, such as register files to store instruction processing results. However, threads 901a and 901b are potentially capable of out-of-order execution, where allocator and renamer block 930 also reserves other resources, such as reorder buffers to track instruction results. Unit 930 may also include a register renamer to rename program/instruction reference registers to other registers internal to processor 900. Reorder/retirement unit 935 includes components, such as the reorder buffers mentioned above, load buffers, and store buffers, to support out-of-order execution and later in-order retirement of instructions executed out-of-order.

Scheduler and execution unit(s) block 940, in one embodiment, includes a scheduler unit to schedule instructions/operation on execution units. For example, a floating point instruction is scheduled on a port of an execution unit that has an available floating point execution unit. Register files associated with the execution units are also included to store information instruction processing results. Exemplary execution units include a floating point execution unit, an integer execution unit, a jump execution unit, a load execution unit, a store execution unit, and other known execution units.

Lower level data cache and data translation buffer (D-TLB) 950 are coupled to execution unit(s) 940. The data cache is to store recently used/operated on elements, such as data operands, which are potentially held in memory coherency states. The D-TLB is to store recent virtual/linear to physical address translations. As a specific example, a processor may include a page table structure to break physical memory into a plurality of virtual pages.

Here, cores 901 and 902 share access to higher-level or further-out cache, such as a second level cache associated with on-chip interface 910. Note that higher-level or further-out refers to cache levels increasing or getting further way from the execution unit(s). In one embodiment, higher-level cache is a last-level data cache—last cache in the memory hierarchy on processor 900—such as a second or third level data cache. However, higher level cache is not so limited, as it may be associated with or include an instruction cache. A trace cache—a type of instruction cache—instead may be coupled after decoder 925 to store recently decoded traces. Here, an instruction potentially refers to a macro-instruction (i.e. a general instruction recognized by the decoders), which may decode into a number of micro-instructions (micro-operations).

In the depicted configuration, processor 900 also includes on-chip interface module 910. Historically, a memory controller, which is described in more detail below, has been included in a computing system external to processor 900. In this scenario, on-chip interface 910 is to communicate with devices external to processor 900, such as system memory 975, a chipset (often including a memory controller hub to connect to memory 975 and an I/O controller hub to connect peripheral devices), a memory controller hub, a northbridge, or other integrated circuit. And in this scenario, bus 905 may include any known interconnect, such as multi-drop bus, a point-to-point interconnect, a serial interconnect, a parallel bus, a coherent (e.g. cache coherent) bus, a layered protocol architecture, a differential bus, and a GTL bus.

Memory 975 may be dedicated to processor 900 or shared with other devices in a system. Common examples of types of memory 975 include DRAM, SRAM, non-volatile memory (NV memory), and other known storage devices. Note that device 980 may include a graphic accelerator, processor or card coupled to a memory controller hub, data storage coupled to an I/O controller hub, a wireless transceiver, a flash device, an audio controller, a network controller, or other known device.

Recently however, as more logic and devices are being integrated on a single die, such as SOC, each of these devices may be incorporated on processor 900. For example in one embodiment, a memory controller hub is on the same package and/or die with processor 900. Here, a portion of the core (an on-core portion) 910 includes one or more controller(s) for interfacing with other devices such as memory 975 or a graphics device 980. The configuration including an interconnect and controllers for interfacing with such devices is often referred to as an on-core (or un-core configuration). As an example, on-chip interface 910 includes a ring interconnect for on-chip communication and a high-speed serial point-to-point link 905 for off-chip communication. Yet, in the SOC environment, even more devices, such as the network interface, co-processors, memory 975, graphics processor 980, and any other known computer devices/interface may be integrated on a single die or integrated circuit to provide small form factor with high functionality and low power consumption.

In one embodiment, processor 900 is capable of executing a compiler, optimization, and/or translator code 977 to compile, translate, and/or optimize application code 976 to support the apparatus and methods described herein or to interface therewith. A compiler often includes a program or set of programs to translate source text/code into target text/code. Usually, compilation of program/application code with a compiler is done in multiple phases and passes to transform hi-level programming language code into low-level machine or assembly language code. Yet, single pass compilers may still be utilized for simple compilation. A compiler may utilize any known compilation techniques and perform any known compiler operations, such as lexical analysis, preprocessing, parsing, semantic analysis, code generation, code transformation, and code optimization.

Larger compilers often include multiple phases, but most often these phases are included within two general phases: (1) a front-end, i.e. generally where syntactic processing, semantic processing, and some transformation/optimization may take place, and (2) a back-end, i.e. generally where analysis, transformations, optimizations, and code generation takes place. Some compilers refer to a middle, which illustrates the blurring of delineation between a front-end and back end of a compiler. As a result, reference to insertion, association, generation, or other operation of a compiler may take place in any of the aforementioned phases or passes, as well as any other known phases or passes of a compiler. As an illustrative example, a compiler potentially inserts operations, calls, functions, etc. in one or more phases of compilation, such as insertion of calls/operations in a front-end phase of compilation and then transformation of the calls/operations into lower-level code during a transformation phase. Note that during dynamic compilation, compiler code or dynamic optimization code may insert such operations/calls, as well as optimize the code for execution during runtime. As a specific illustrative example, binary code (already compiled code) may be dynamically optimized during runtime. Here, the program code may include the dynamic optimization code, the binary code, or a combination thereof.

Similar to a compiler, a translator, such as a binary translator, translates code either statically or dynamically to optimize and/or translate code. Therefore, reference to execution of code, application code, program code, or other software environment may refer to: (1) execution of a compiler program(s), optimization code optimizer, or translator either dynamically or statically, to compile program code, to maintain software structures, to perform other operations, to optimize code, or to translate code; (2) execution of main program code including operations/calls, such as application code that has been optimized/compiled; (3) execution of other program code, such as libraries, associated with the main program code to maintain software structures, to perform other software related operations, or to optimize code; or (4) a combination thereof.

Figure 10:
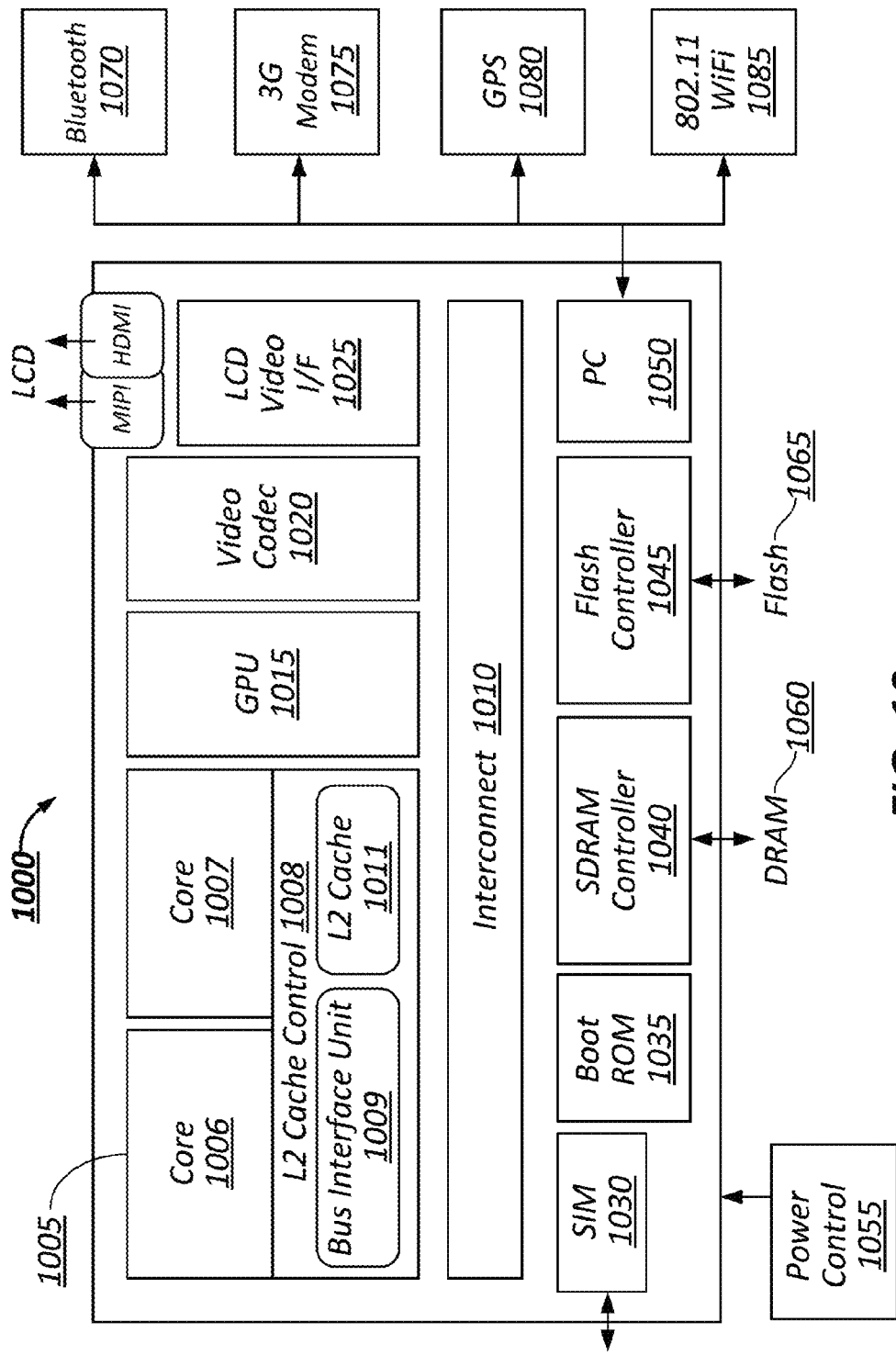
FIG. 10 illustrates another embodiment of a block diagram for a computing system.

Turning next to FIG. 10, an embodiment of a system on-chip (SOC) design in accordance with the inventions is depicted. As a specific illustrative example, SOC 1000 is included in user equipment (UE). In one embodiment, UE refers to any device to be used by an end-user to communicate, such as a hand-held phone, smartphone, tablet, ultra-thin notebook, notebook with broadband adapter, or any other similar communication device. Often a UE connects to a base station or node, which potentially corresponds in nature to a mobile station (MS) in a GSM network.

Here, SOC 1000 includes 2 cores—1006 and 1007. Similar to the discussion above, cores 1006 and 1007 may conform to an Instruction Set Architecture, such as an Intel® Architecture Core™-based processor, an Advanced Micro Devices, Inc. (AMD) processor, a MIPS-based processor, an ARM-based processor design, or a customer thereof, as well as their licensees or adopters. Cores 1006 and 1007 are coupled to cache control 1008 that is associated with bus interface unit 1009 and L2 cache 1011 to communicate with other parts of system 1000. Interconnect 1010 includes an on-chip interconnect, such as an IOSF, AMBA, or other interconnect discussed above, which potentially implements one or more aspects of described herein.

Interface 1010 provides communication channels to the other components, such as a Subscriber Identity Module (SIM) 1030 to interface with a SIM card, a boot rom 1035 to hold boot code for execution by cores 1006 and 1007 to initialize and boot SOC 1000, a SDRAM controller 1040 to interface with external memory (e.g. DRAM 1060), a flash controller 1045 to interface with non-volatile memory (e.g. Flash 1065), a peripheral control 1050 (e.g. Serial Peripheral Interface) to interface with peripherals, video codecs 1020 and Video interface 1025 to display and receive input (e.g. touch enabled input), GPU 1015 to perform graphics related computations, etc. Any of these interfaces may incorporate aspects of the invention described herein.

In addition, the system illustrates peripherals for communication, such as a Bluetooth module 1070, 3G modem 1075, GPS 1085, and WiFi 1085. Note as stated above, a UE includes a radio for communication. As a result, these peripheral communication modules are not all required. However, in a UE some form a radio for external communication is to be included.

While the present invention has been described with respect to a limited number of embodiments, those skilled in the art will appreciate numerous modifications and variations therefrom. It is intended that the appended claims cover all such modifications and variations as fall within the true spirit and scope of this present invention.

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit.

In some implementations, software based hardware models, and HDL and other functional description language objects can include register transfer language (RTL) files, among other examples. Such objects can be machine-parsable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the described hardware.

In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Use of the phrase 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0.

Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'to,' 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc, which are to be distinguished from the non-transitory mediums that may receive information there from.

Instructions used to program logic to perform embodiments of the invention may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

The following examples pertain to embodiments in accordance with this Specification. One or more embodiments may provide an apparatus, a system, a machine readable storage, a machine readable medium, hardware- and/or software-based logic, and a method to identify a topology metadata file, where the topology metadata file is to describe a topology of a system on chip (SoC) to be created and the topology is to include a plurality of computing blocks to be interconnected by a fabric, identify, for each of the plurality of computing blocks, a corresponding computing block metadata file, where each of the computing block metadata files is to describe attributes of the corresponding computing block, parse the topology metadata file and the computing block metadata files to identify configuration attributes of the SoC, and generate an intermediate representation of the SoC based on the configuration attributes.

In at least one example, each of the identified computing block metadata files identifies one or more entries in a library of decode information and the entries describe information for use in decoding transactions involving the corresponding computing block.

In at least one example, the library of decode information is to include a plurality of entries.

In at least one example, each entry describes attributes of configuration space of a function and one or more supported transactions of the function.

In at least one example, the configuration space includes a respective base address register (BAR).

In at least one example, the attributes include a type and size of the BAR.

In at least one example, the intermediate representation is to incorporate one or more shadow registers to facilitate decoding of transactions involving a particular one of the plurality of computing blocks based on a particular decode information library entry identified in a particular computing block metadata file associated with the particular computing block.

In at least one example, the particular computing block metadata file is to be parsed to identify a reference to the particular decode information library entry and the particular decode information library entry in association with generation of the intermediate representation.

In at least one example, the attributes include performance targets for one or more of the computing blocks.

In at least one example, the attributes include a number of channels supported by a corresponding computing block.

In at least one example, the attributes include maximum payload sizes supported for each of the channels supported by the corresponding computing block.

In at least one example, the attributes include a bus width of the corresponding computing block.

In at least one example, at least a first one of the computing block metadata files is from a first source, the first computing block metadata file corresponds to a first one of the plurality of computing blocks, the first computing block is provided by a first entity associated with the first source, at least a second one of the computing block metadata files is from a different second source, the second computing block metadata file corresponds to a second one of the plurality of computing blocks, and the second computing block is provided by a second entity associated with the second source.

In at least one example, the first and second computing block metadata files each include respective text data and both are according to a defined syntax for computing block metadata files.

In at least one example, the intermediate representation is to model buffer sizes on the SoC and the attributes are to be used to determine minimum buffer size settings on the SoC.

In at least one example, the intermediate representation includes a model with a configuration to guarantee a functional version of the SoC.

In at least one example, the intermediate representation includes a hardware definition language object.

In at least one example, the plurality of computing blocks includes at least two instances of a particular computing block and a common computing block metadata file is to be used to identify configuration attributes of each of the two instances of the particular computing block.

One or more embodiments may provide a system including one or more processor devices, one or more memory elements, a repository of a plurality of computing block metadata files, where each of the computing block metadata files describes attributes of a corresponding one of a plurality of computing blocks, and a system on chip (SoC) design tool. The SoC design tool can identify a topology metadata file, where the topology metadata file describes a topology of a system on chip (SoC) to be created and the topology is to include a subset of the plurality of computing blocks to be interconnected by a fabric. The SoC design tool can further identify, for each of the plurality of computing blocks, a corresponding one of the plurality of computing block metadata files, parse the topology metadata file and the identified computing block metadata files to identify configuration attributes of the SoC, and generate an intermediate representation of the SoC based on the configuration attributes.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the invention as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. A non-transitory computer readable medium comprising code that, when executed, is to cause a computing device to:
    identify, in computer memory, a topology metadata file, wherein the topology metadata file is to describe a topology of a system on chip (SoC) to be created and the topology is to comprise a plurality of computing blocks to be interconnected by a fabric;
    determine, from the topology metadata file, the plurality of computing blocks;
    identify, for each of the plurality of computing blocks, a corresponding computing block metadata file, wherein each of the computing block metadata files is to describe attributes of the corresponding computing block to be added to the SoC, each of the computing block metadata files identifies one or more entries in a library of decode information, and the entries describe information for use in decoding transactions involving the corresponding computing block;
    parse the topology metadata file and the computing block metadata files to identify configuration attributes to be applied to the SoC; and
    generate data comprising an intermediate representation of the SoC based on the configuration attributes.

2. The medium of claim 1, wherein the library of decode information is to comprise a plurality of entries.

3. The medium of claim 2, wherein each entry describes attributes of configuration space of a function and one or more supported transactions of the function.

4. The medium of claim 3, wherein the configuration space comprises a respective base address register (BAR).

5. The medium of claim 4, wherein the attributes comprise a type and size of the BAR.

6. The medium of claim 1, wherein the intermediate representation is to incorporate one or more shadow registers to facilitate decoding of transactions involving a particular one of the plurality of computing blocks based on a particular decode information library entry identified in a particular computing block metadata file associated with the particular computing block.

7. The medium of claim 6, wherein the particular computing block metadata file is to be parsed to identify a reference to the particular decode information library entry and the particular decode information library entry is to be associated with the intermediate representation.

8. The medium of claim 1, wherein the attributes comprise performance targets for one or more of the computing blocks.

9. The medium of claim 1, wherein the attributes comprise a number of channels supported by a corresponding computing block.

10. The medium of claim 9, wherein the attributes comprise maximum payload sizes supported for each of the channels supported by the corresponding computing block.

11. The medium of claim 1, wherein the attributes comprise a bus width of the corresponding computing block.

12. The medium of claim 1, wherein at least a first one of the computing block metadata files is from a first source, the first computing block metadata file corresponds to a first one of the plurality of computing blocks, the first computing block is provided by a first entity associated with the first source, at least a second one of the computing block metadata files is from a different second source, the second computing block metadata file corresponds to a second one of the plurality of computing blocks, and the second computing block is provided by a second entity associated with the second source.

13. The medium of claim 12, wherein the first and second computing block metadata files each comprise respective text data and both are according to a defined syntax for computing block metadata files.

14. The medium of claim 1, wherein the intermediate representation is to model buffer sizes on the SoC and the attributes are to be used to determine minimum buffer size settings on the SoC.

15. The medium of claim 14, wherein the intermediate representation comprises a model with a configuration to guarantee a functional version of the SoC.

16. The medium of claim 1, wherein the intermediate representation comprises a hardware definition language object.

17. The medium of claim 1, wherein the plurality of computing blocks comprises at least two instances of a particular computing block and a common computing block metadata file is to be used to identify configuration attributes of each of the two instances of the particular computing block.

18. A method comprising:
identifying, in computer memory, a topology metadata file, wherein the topology metadata file describes a topology of a system on chip (SoC) to be created and the topology is to comprise a plurality of computing blocks to be interconnected by a fabric;
determining from the topology metadata file, using at least one processor device, the plurality of computing blocks;
identifying, for each of the plurality of computing blocks, a corresponding computing block metadata file, wherein each of the computing block metadata files describes attributes of the corresponding computing block to be included in the SoC, each of the computing block metadata files identifies one or more entries in a library of decode information, and the entries describe information for use in decoding transactions involving the corresponding computing block;
parsing the topology metadata file and the computing block metadata files, using at least one processor, to identify configuration attributes to be applied in the SoC; and
generating, using at least one processor, data comprising an intermediate representation of the SoC based on the configuration attributes.

19. A system comprising:
one or more processor devices;
one or more memory elements;
a repository of a plurality of computing block metadata files, wherein each of the computing block metadata files describes attributes of a corresponding one of a plurality of computing blocks;
a system on chip (SoC) design tool to:
identify a topology metadata file, wherein the topology metadata file describes a topology of a system on chip (SoC) to be created and the topology is to comprise a subset of the plurality of computing blocks to be interconnected by a fabric;
determine, from the topology metadata file, the plurality of computing blocks;
identify, for each of the plurality of computing blocks, a corresponding one of the plurality of computing block metadata files, wherein each of the computing block metadata files is to describe attributes of a corresponding one of the plurality of computing blocks to be added to the SoC, each of the computing block metadata files identifies one or more entries in a library of decode information, and the entries describe information for use in decoding transactions involving the corresponding computing block;
parse the topology metadata file and the identified computing block metadata files to identify configuration attributes of the SoC; and
generate an intermediate representation of the SoC based on the configuration attributes.

* * * * *

UNITED STATES PATENT AND TRADEMARK OFFICE
CERTIFICATE OF CORRECTION

PATENT NO. : 9,727,679 B2  
APPLICATION NO. : 14/578418  
DATED : August 8, 2017  
INVENTOR(S) : Robert P. Adler Page 1 of 1

It is certified that error appears in the above-identified patent and that said Letters Patent is hereby corrected as shown below:

In the Drawings

On sheet 11 of 12, in FIG. 9, Line 1, Ref. Numeral 930, delete "Rename/Allocater" and insert -- Rename/Allocator --, therefor.

On sheet 11 of 12, in FIG. 9, Line 1, Ref. Numeral 931, delete "Rename/Allocater" and insert -- Rename/Allocator --, therefor.

Signed and Sealed this  
Tenth Day of April, 2018

Andrei Iancu  
*Director of the United States Patent and Trademark Office*